US 12,519,030 B2

(12) United States Patent
Yoshitsugu et al.

(10) Patent No.: US 12,519,030 B2
(45) Date of Patent: Jan. 6, 2026

(54) SEMICONDUCTOR DEVICE INCLUDING DIAMOND SUBSTRATE AND SEMICONDUCTOR DEVICE MANUFACTURING METHOD

(71) Applicant: Mitsubishi Electric Corporation, Tokyo (JP)

(72) Inventors: Koji Yoshitsugu, Tokyo (JP); Keisuke Nakamura, Tokyo (JP); Eiji Yagyu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 923 days.

(21) Appl. No.: 17/601,931

(22) PCT Filed: Jun. 18, 2019

(86) PCT No.: PCT/JP2019/024117
§ 371 (c)(1),
(2) Date: Oct. 7, 2021

(87) PCT Pub. No.: WO2020/255259
PCT Pub. Date: Dec. 24, 2020

(65) Prior Publication Data
US 2022/0148941 A1    May 12, 2022

(51) Int. Cl.
*H01L 23/373*    (2006.01)
*H01L 21/02*    (2006.01)
(Continued)

(52) U.S. Cl.
CPC ...... *H01L 23/3732* (2013.01); *H01L 21/0254* (2013.01); *H01L 21/4803* (2013.01);
(Continued)

(58) Field of Classification Search
None
See application file for complete search history.

(56) References Cited

U.S. PATENT DOCUMENTS 6,956,250 B2    10/2005    Borges et al.
8,143,654 B1     3/2012    Saunier
(Continued)

FOREIGN PATENT DOCUMENTS

JP    H04-311069 A    11/1992
JP    11-283944 A    10/1999
(Continued)

OTHER PUBLICATIONS

Office Action issued Jan. 10, 2024 in Chinese Patent Application No. 201980097305.X, 18 pages.
(Continued)

*Primary Examiner* — Sue A Purvis
*Assistant Examiner* — Carnell Hunter, III
(74) *Attorney, Agent, or Firm* — XSENSUS LLP

(57) ABSTRACT

It is an object of the present invention to provide a semiconductor device having high heat dissipation performance. A semiconductor device includes: a diamond substrate having a recess in an upper surface thereof; a nitride semiconductor layer disposed within the recess in the upper surface of the diamond substrate; and an electrode disposed on the nitride semiconductor layer, wherein the nitride semiconductor layer and the electrode constitute a field-effect transistor, the diamond substrate has a source via hole extending through a thickness of the diamond substrate to expose the source electrode, and the semiconductor device further includes a via metal covering an inner wall of the source via hole and a lower surface of the diamond substrate.

14 Claims, 33 Drawing Sheets

(51) Int. Cl.
  *H01L 21/48* (2006.01)
  *H10D 30/01* (2025.01)
  *H10D 30/47* (2025.01)
  *H10D 62/85* (2025.01)
  *H10D 64/01* (2025.01)
  *H10D 64/23* (2025.01)
(52) U.S. Cl.
  CPC ......... *H10D 30/015* (2025.01); *H10D 30/475* (2025.01); *H10D 62/8503* (2025.01); *H10D 64/01* (2025.01); *H10D 64/254* (2025.01)

(56) References Cited

U.S. PATENT DOCUMENTS

| | | | |
|---|---|---|---|
| 8,575,657 B2 | 11/2013 | Gambin et al. | |
| 11,205,704 B2 * | 12/2021 | Tsunami | H01L 29/401 |
| 2013/0119370 A1 | 5/2013 | Wu et al. | |
| 2013/0193446 A1 * | 8/2013 | Chao | H01L 21/02664 |
| | | | 257/E27.059 |
| 2013/0248879 A1 * | 9/2013 | Gambin | H01L 23/3732 |
| | | | 257/77 |
| 2014/0110722 A1 * | 4/2014 | Kub | H01L 29/7787 |
| | | | 257/77 |
| 2017/0018638 A1 | 1/2017 | Teo et al. | |
| 2018/0068923 A1 | 3/2018 | Kotani et al. | |
| 2020/0303509 A1 * | 9/2020 | Mehandru | H01L 23/485 |
| 2022/0246444 A1 * | 8/2022 | Ahmed | H01L 21/4803 |

FOREIGN PATENT DOCUMENTS

| | | | | |
|---|---|---|---|---|
| JP | 4311939 B2 | 8/2009 | | |
| JP | 2011-040597 A | 2/2011 | | |
| JP | 6174113 B2 | 8/2017 | | |
| JP | 2018-041785 A | 3/2018 | | |
| JP | 6448865 B | 12/2018 | | |
| JP | 6448865 B1 * | 1/2019 | ......... | H01L 21/7624 |

OTHER PUBLICATIONS

Office Action mailed Sep. 21, 2023, in German Application No. 11 2019 007 477.6, 24 pages.
International Search Report and Written Opinion mailed on Sep. 17, 2019, received for PCT Application PCT/JP2019/024117, Filed on Jun. 18, 2019, 7 pages including English Translation.
Jessen et al., "AlGaN/GaN HEMT on Diamond Technology Demonstration", Proceedings of CSICS, IEEE, 2006, pp. 271-274.
Japanese Office Action issued Jul. 26, 2022 in corresponding Japanese Patent Application No. 2021-528503, with English translation.
Office Action issued May 28, 2024 in German Patent Application No. 11 2019 007 477.6, 10 pages.
Office Action issued Aug. 1, 2024 in corresponding Chinese Patent Application No. 201980097305.X.
Notice of Retrial issued May 19, 2025 in corresponding Chinese patent application No. CN 201980097305.X (15 pages; with English machine translation).
Decision on Re-examination issued Aug. 13, 2025 in corresponding Chinese patent application No. 201980097305 (28 pages; with English machine translation).
Decision on Re-examination issued Aug. 13, 2025 in corresponding Chinese patent application No. 201980097305.X (28 pages; with English machine translation).

* cited by examiner

F I G. 1
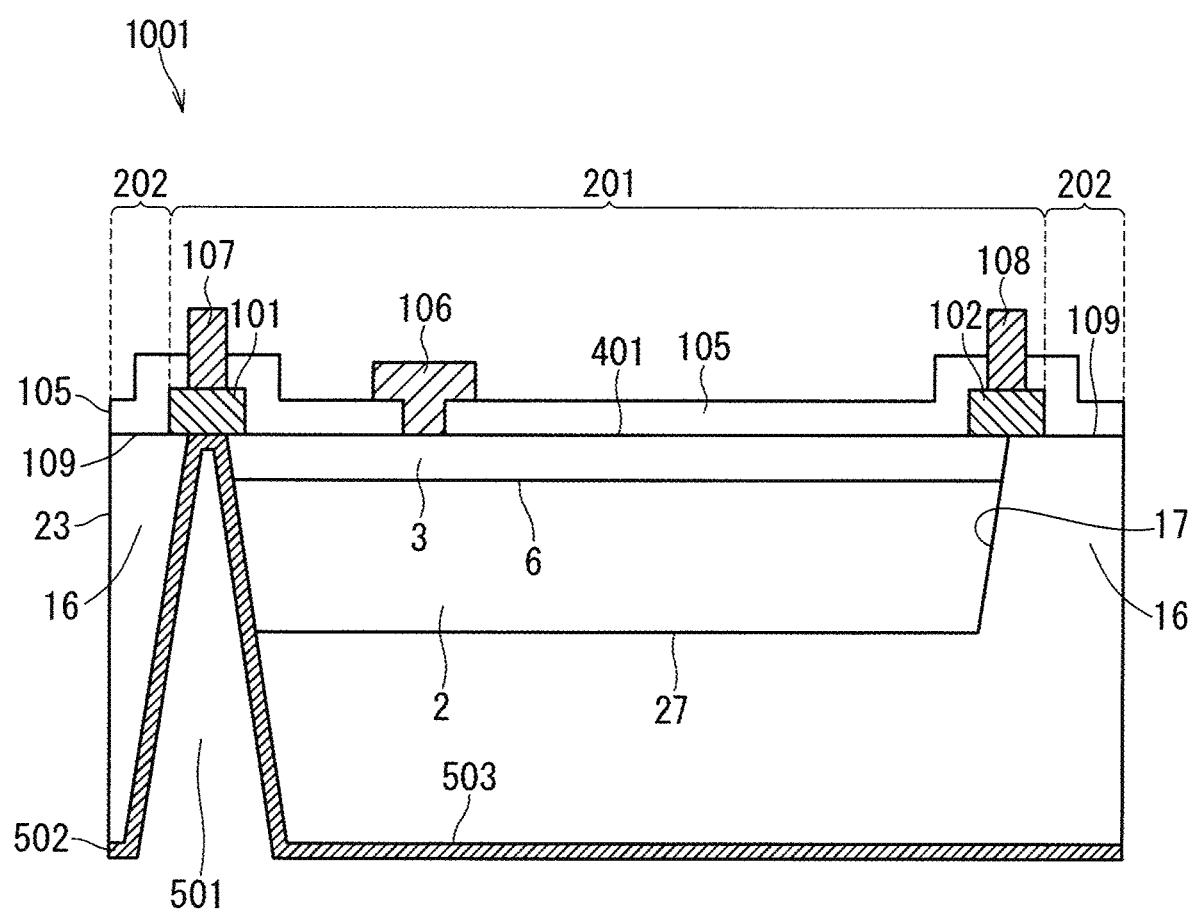

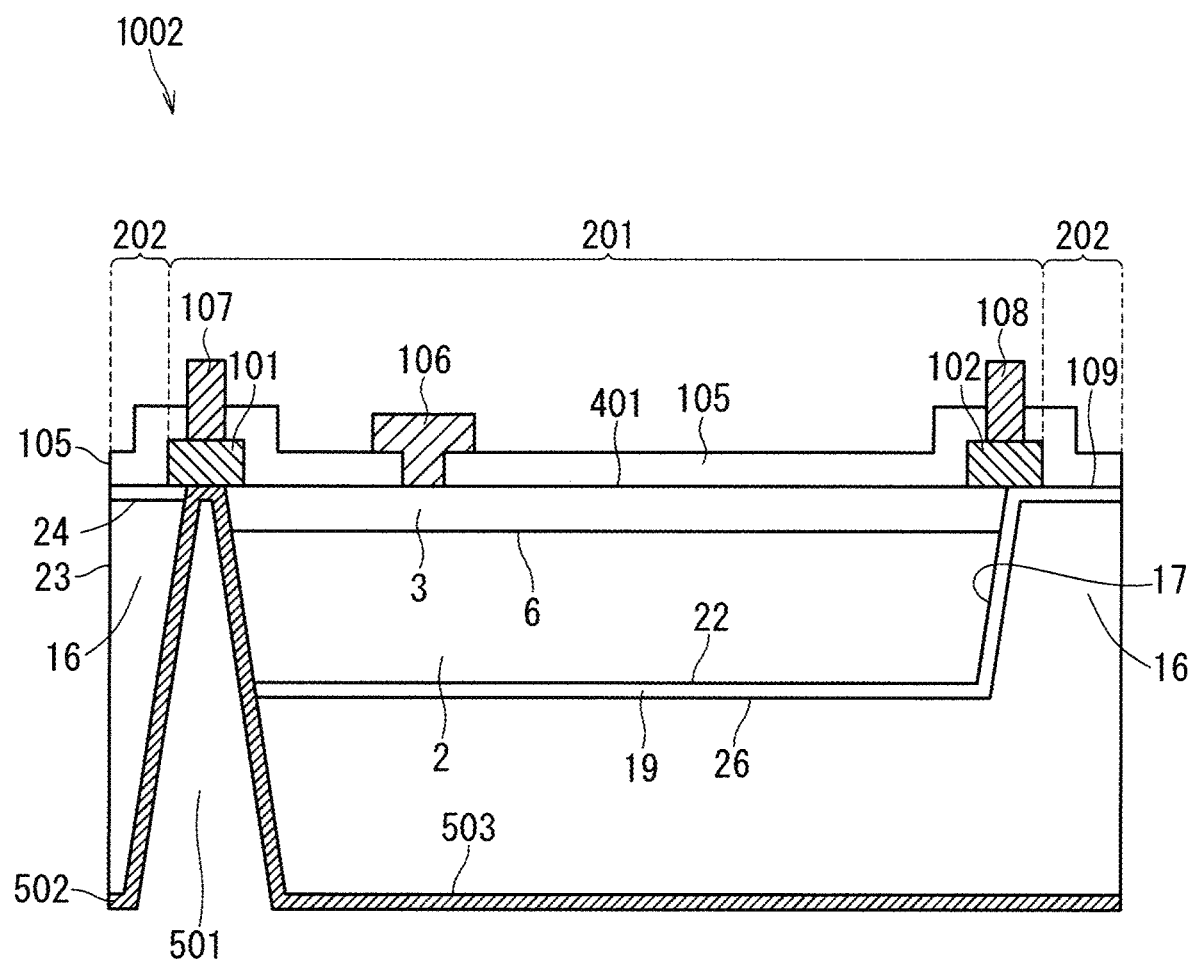
F I G. 6

F I G. 7
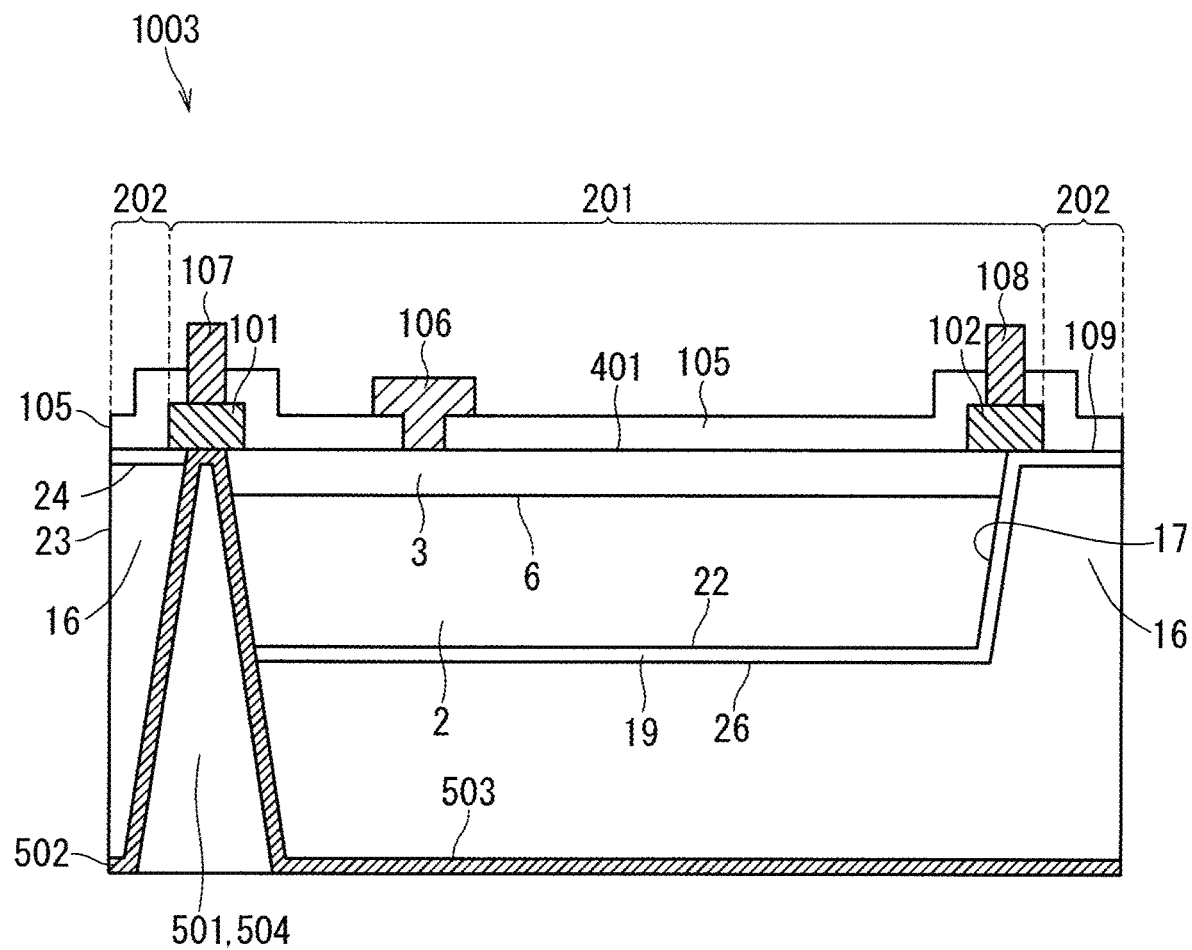

F I G. 3 8
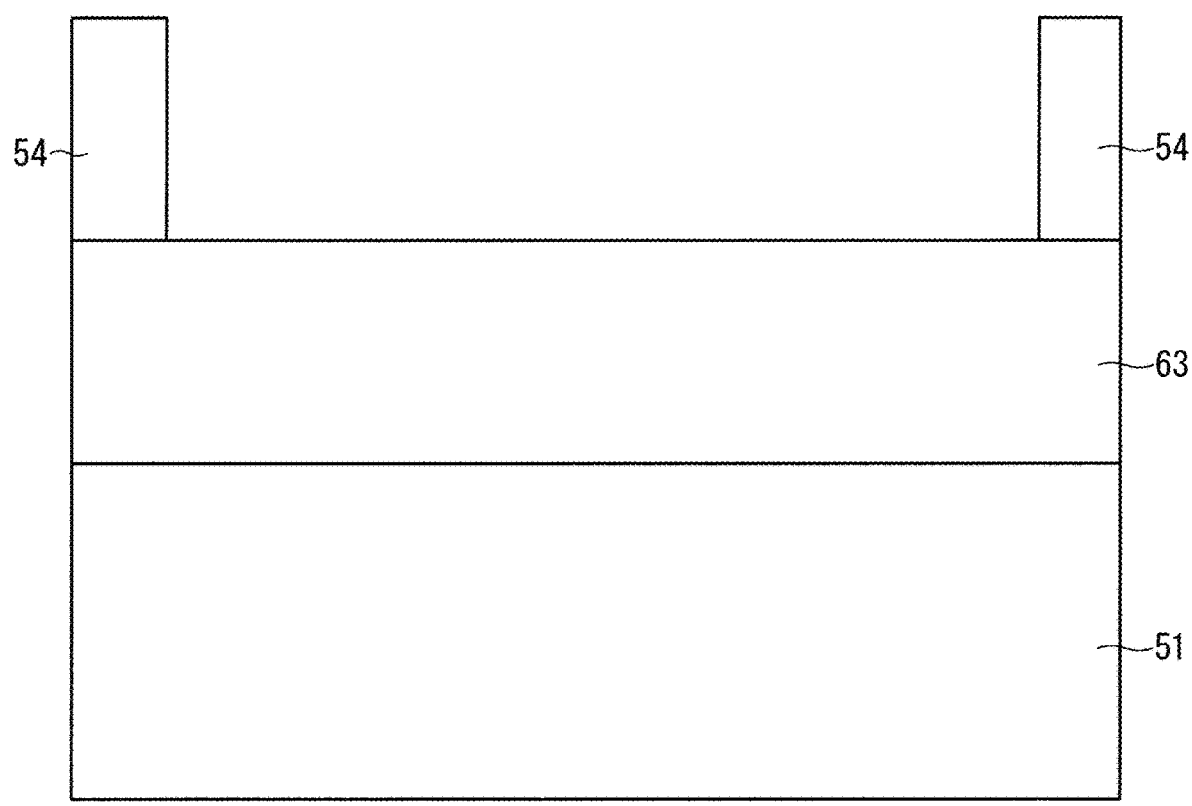

F I G. 3 9

F I G. 4 0
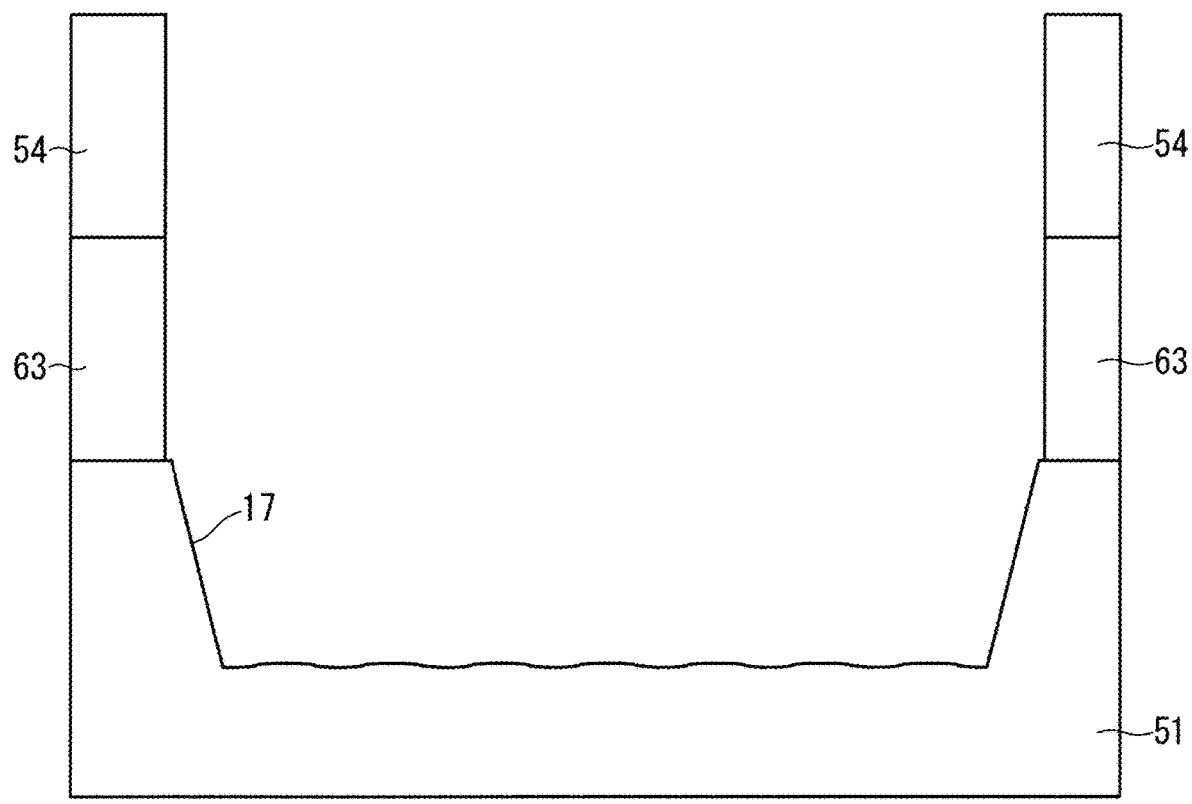

F I G. 4 9
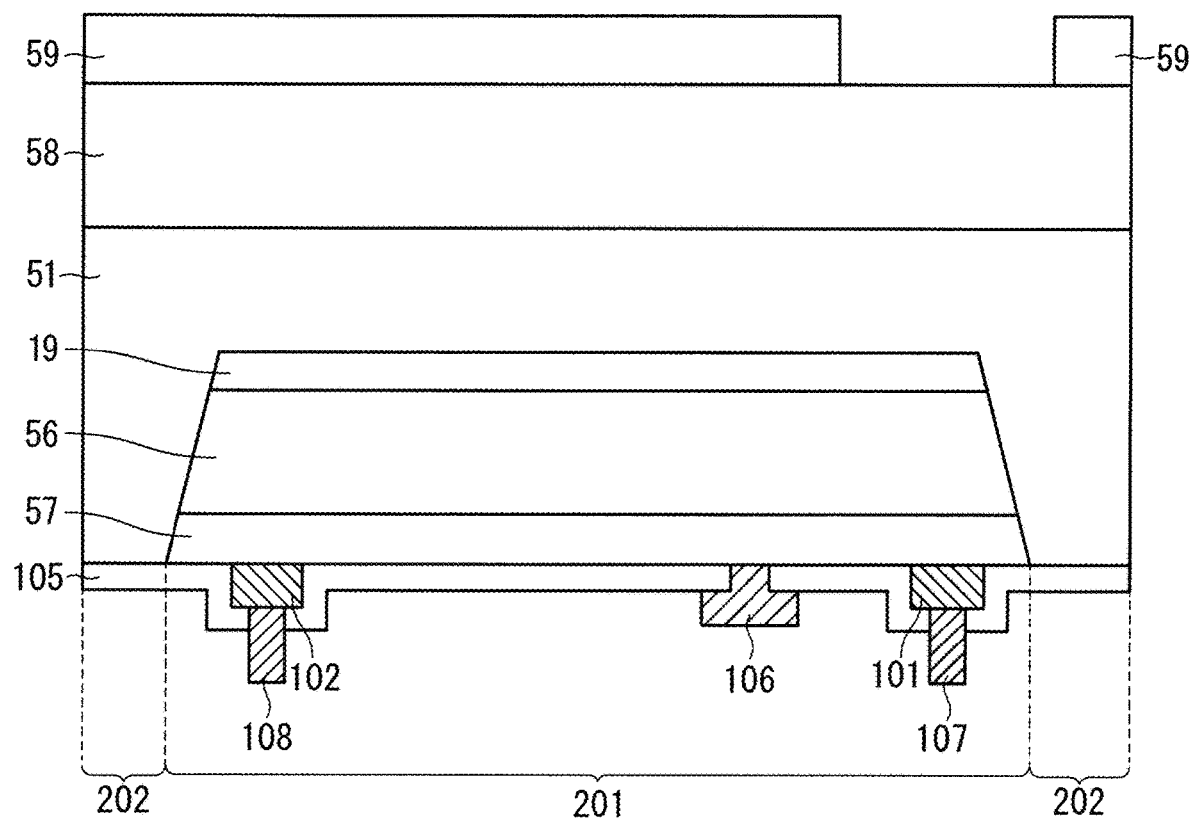

F I G. 5 1
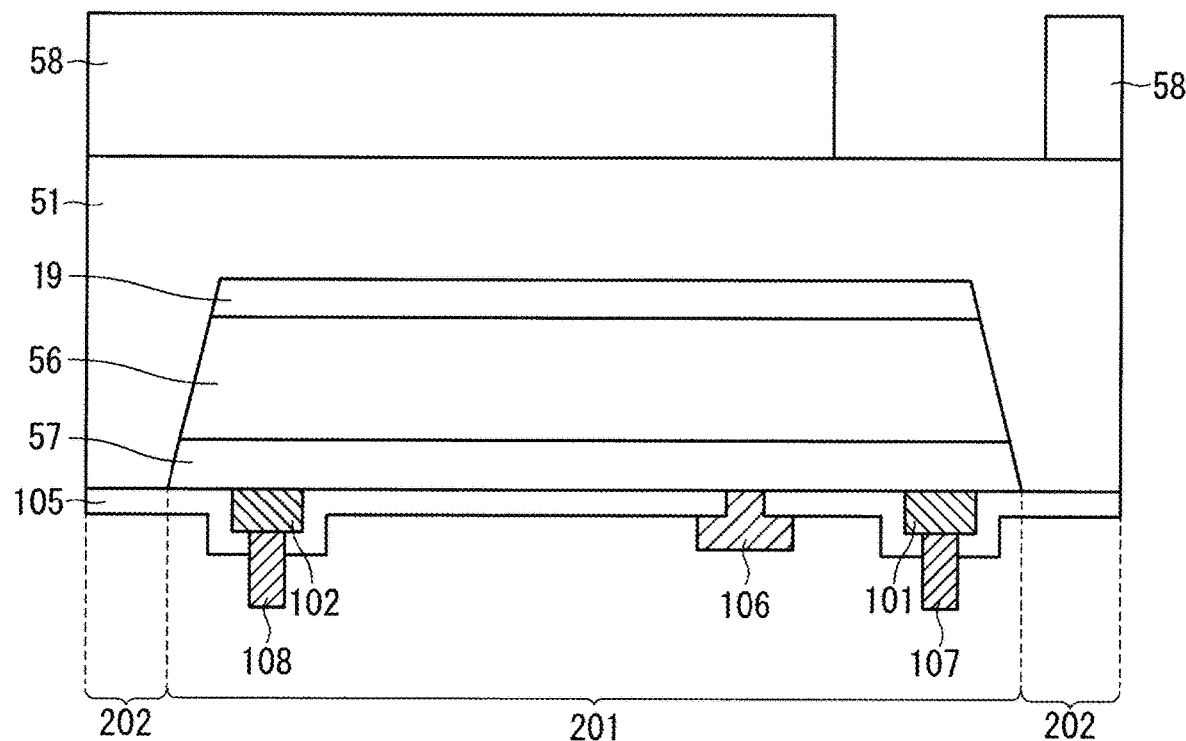
F I G. 5 2
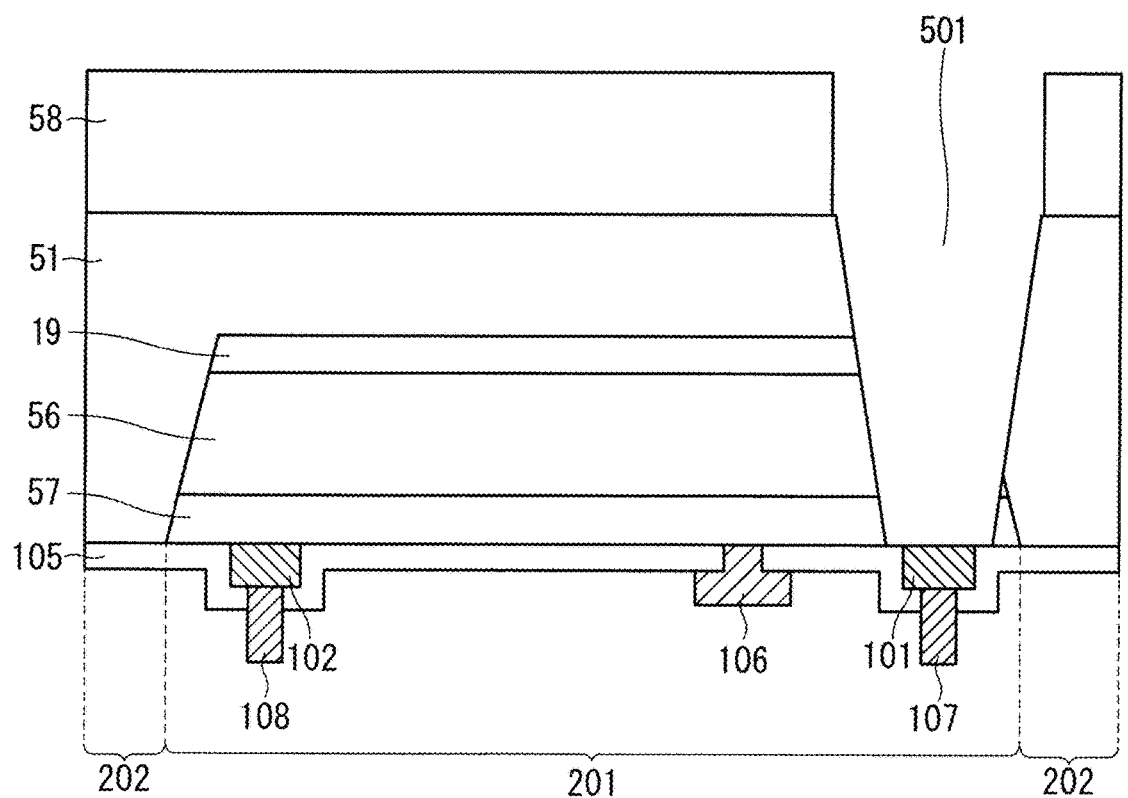

F I G. 5 5
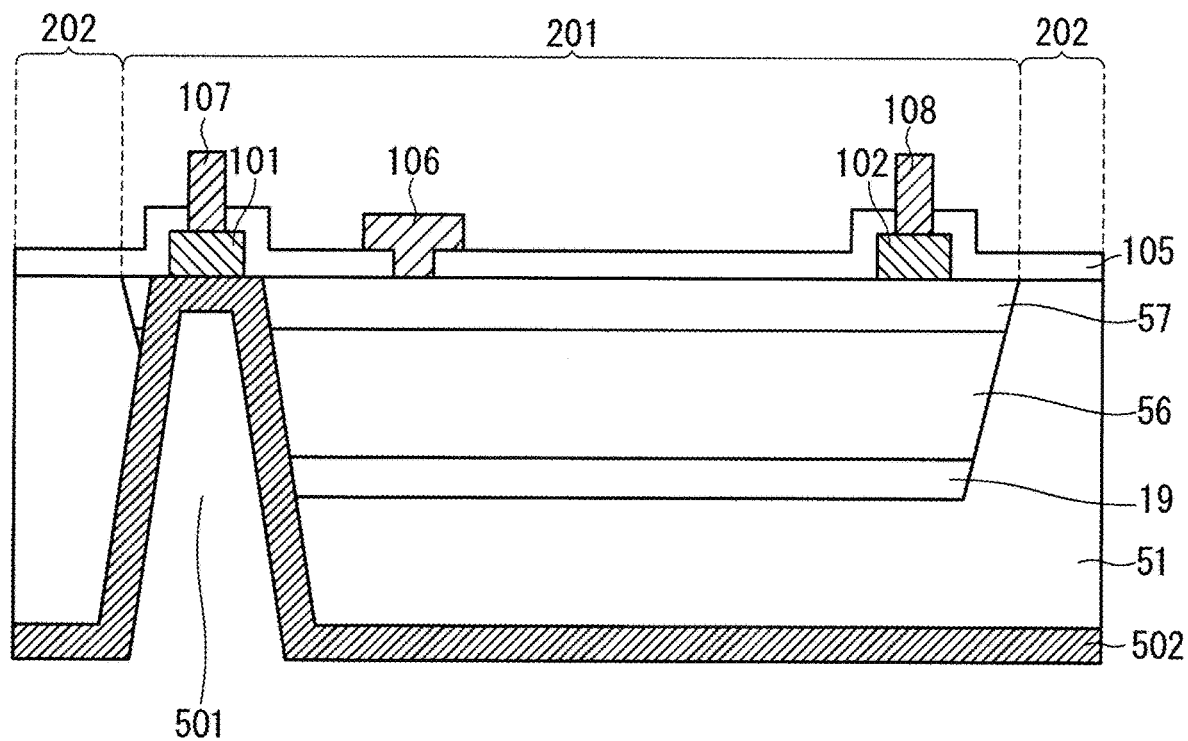

SEMICONDUCTOR DEVICE INCLUDING DIAMOND SUBSTRATE AND SEMICONDUCTOR DEVICE MANUFACTURING METHOD

CROSS-REFERENCE TO RELATED APPLICATION

The present application is based on PCT filing PCT/JP2019/024117, filed Jun. 18, 2019, the entire contents of which are incorporated herein by reference.

TECHNICAL FIELD

The present invention relates to semiconductor devices and methods for manufacturing a semiconductor device.

BACKGROUND ART

As a semiconductor device operating at high power and high frequencies, a field-effect transistor formed of a nitride based semiconductor has been used, for example. However, a phenomenon of reduction in properties or reliability of the semiconductor device due to an increase in temperature in the semiconductor device during high-power operation has been a problem. To suppress the increase in temperature in the semiconductor device, it is important to provide a highly heat dissipating material or structure near a heat generator. Diamond, which has the highest thermal conductivity of all the solid materials, is the optimum material for heat dissipation. In a conventional semiconductor device including a diamond substrate, a via provided in a portion of the substrate of the semiconductor device is filled with diamond. Heat generated in the semiconductor device is thereby allowed to escape along the thickness (see Patent Document 1, for example). On the other hand, in a semiconductor device expected to have a higher heat dissipation effect, heat generated in the semiconductor device is efficiently allowed to escape diffusely when a substrate as a whole of the semiconductor device is formed of diamond (see Non-patent Document 1, for example).

PRIOR ART DOCUMENTS

Patent Document
 Patent Document 1: Japanese Patent No. 6174113
Non-Patent Document
 Non-patent Document 1: G. H. Jessen et al., "AlGaN/GaN HEMT on Diamond Technology Demonstration", in Proceedings of CSICS, IEEE, TX, pp. 271-274 (2006)

SUMMARY

Problem to be Solved by the Invention

To maximize the heat dissipation effect, a material for heat dissipation having high thermal conductivity is required to be disposed near a heat source to efficiently allow heat to escape. In conventional technology, however, diamond as the material for heat dissipation is applied only to the interior of the via provided in the portion of the substrate or only to the substrate, and a direction in which heat is mainly dissipated is limited to a direction along a film thickness. When heat dissipation is limited to that in the direction along the film thickness, an increase in temperature caused in an active region of the semiconductor device might not sufficiently be suppressed. The present invention has been conceived to solve a problem as described above, and it is an object to provide a semiconductor device having high heat dissipation performance.

Means to Solve the Problem

A semiconductor device of the present invention includes: a diamond substrate having a recess in an upper surface thereof; a nitride semiconductor layer disposed within the recess in the upper surface of the diamond substrate; and an electrode disposed on the nitride semiconductor layer, wherein the nitride semiconductor layer and the electrode constitute a field-effect transistor, the electrode includes a source electrode, the diamond substrate has a source via hole extending through a thickness of the diamond substrate to expose the source electrode, and the semiconductor device further includes a via metal covering an inner wall of the source via hole and a lower surface of the diamond substrate.

Effects of the Invention

According to the semiconductor device of the present invention, the nitride semiconductor layer operating as an active layer of the field-effect transistor is disposed within the recess of the diamond substrate. The diamond substrate is adjacent to a side and a bottom of the nitride semiconductor layer, so that heat generated in the nitride semiconductor layer can be dissipated to the diamond substrate adjacent to the side and the bottom of the nitride semiconductor layer to provide high heat dissipation performance. The objects, features, aspects, and advantages of the present invention will become more apparent from the following detailed description and the accompanying drawings.

BRIEF DESCRIPTION OF DRAWINGS

FIG. 1 is a cross-sectional view of a semiconductor device in Embodiment 1.
FIG. 6 is a cross-sectional view of a semiconductor device in Embodiment 2.
FIG. 7 is a cross-sectional view of a semiconductor device in Embodiment 3.

FIG. 38 is a cross-sectional view illustrating the second semiconductor device manufacturing method.

FIG. 39 is a cross-sectional view illustrating the second semiconductor device manufacturing method.

FIG. 40 is a cross-sectional view illustrating the second semiconductor device manufacturing method.

FIG. 49 is a cross-sectional view illustrating the second semiconductor device manufacturing method.

FIG. 51 is a cross-sectional view illustrating the second semiconductor device manufacturing method.

FIG. 52 is a cross-sectional view illustrating the second semiconductor device manufacturing method.

FIG. 55 is a cross-sectional view illustrating the second semiconductor device manufacturing method.

DESCRIPTION OF EMBODIMENTS

Embodiments will be described below with reference to the accompanying drawings.

The drawings are schematically shown, and configurations are omitted or simplified as appropriate for the convenience of description. The sizes of and a positional relationship among configurations shown in different drawings are not necessarily accurate, and can be changed as appropriate. Hatching is sometimes applied to drawings other than a cross-sectional view, such as a plan view, to assist in understanding of the embodiments.

In description made below, similar components bear the same reference signs. That is to say, two components bearing the same reference signs have similar names and functions. Detailed description thereof is thus sometimes omitted to avoid redundancy.

In description made below, terms representing specific locations or directions, such as "upper", "lower", "left", "right", "side", "bottom", "front", and "back", are sometimes used. These terms, however, are used for the sake of convenience for ease of understanding of the embodiments, and do not relate to directions in actual use.

Similar components in a plurality of embodiments described below bear the same reference signs, and detailed description of the similar components will be omitted as appropriate.

A. Embodiment 1

A-1. Configuration

Figure 2:
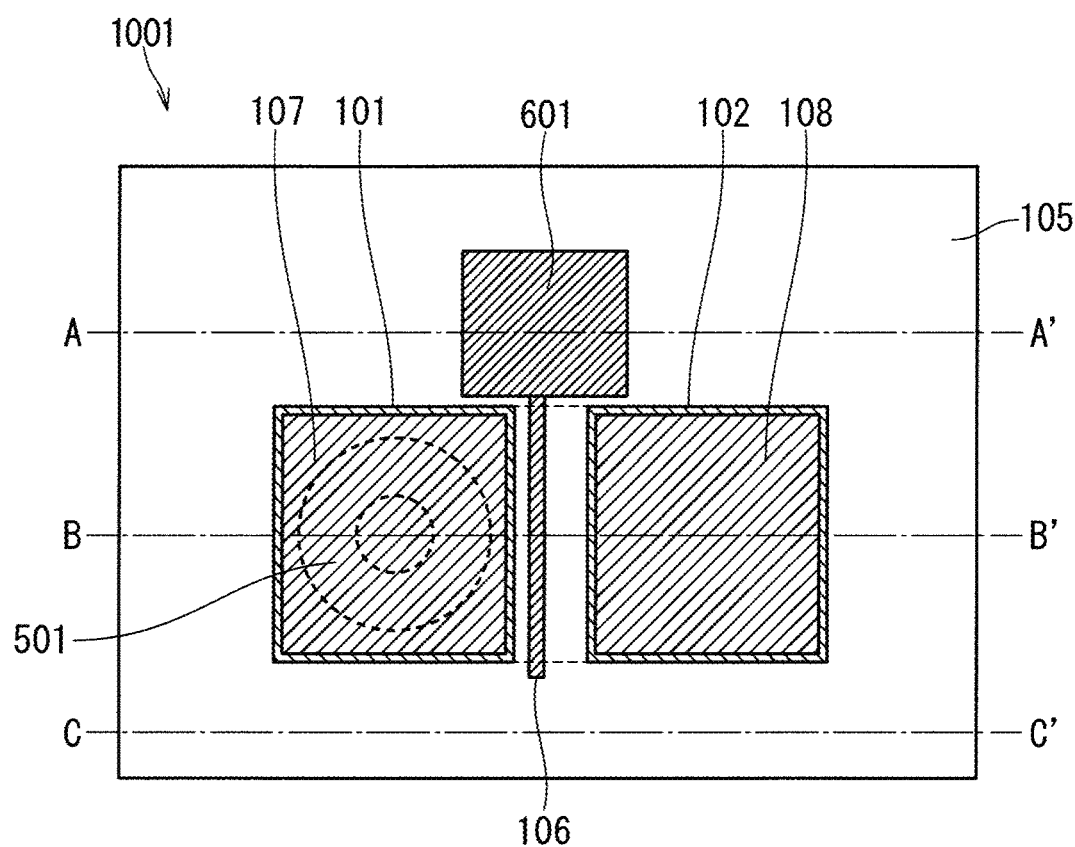
FIG. 2 is a top view of the semiconductor device in Embodiment 1.
Figure 3:
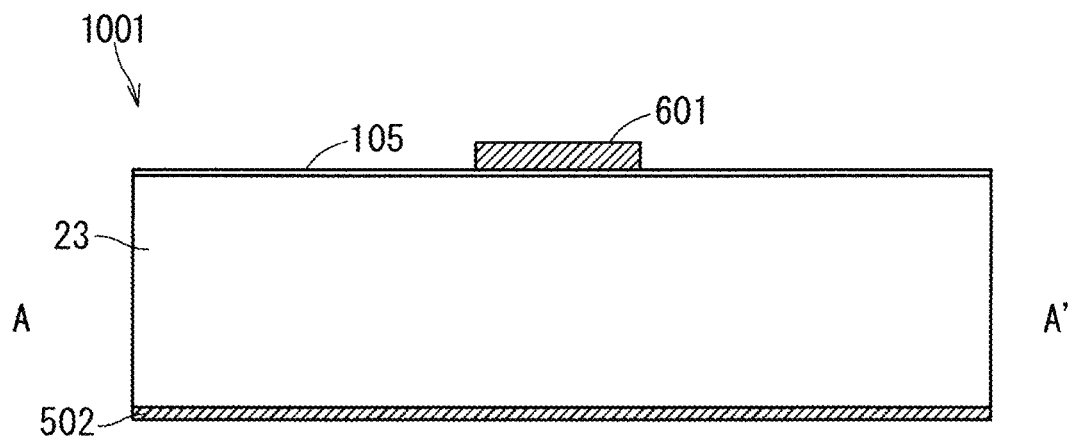
FIG. 3 is a cross-sectional view of the semiconductor device along the line A-A' of FIG. 2.
Figure 4:
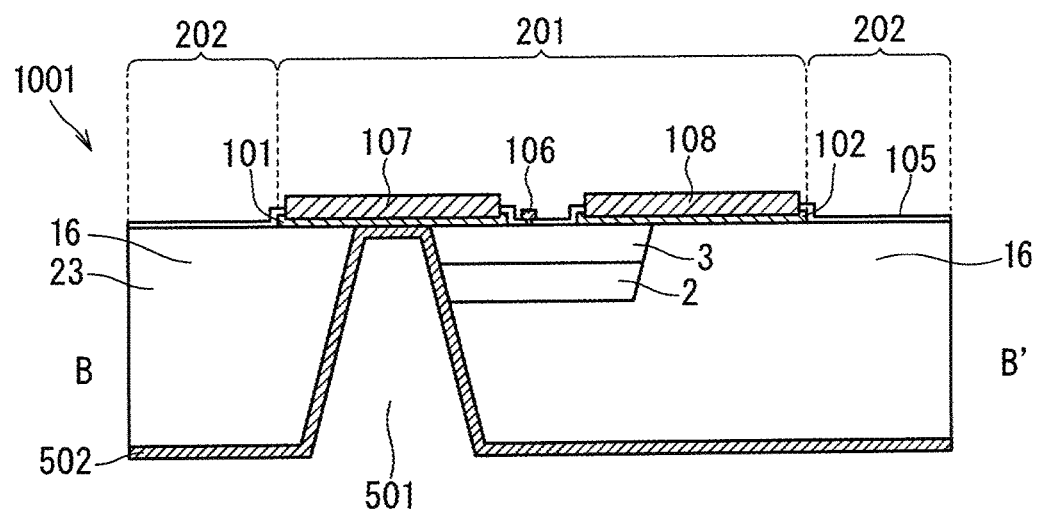
FIG. 4 is a cross-sectional view of the semiconductor device along the line B-B' of FIG. 2.
Figure 5:
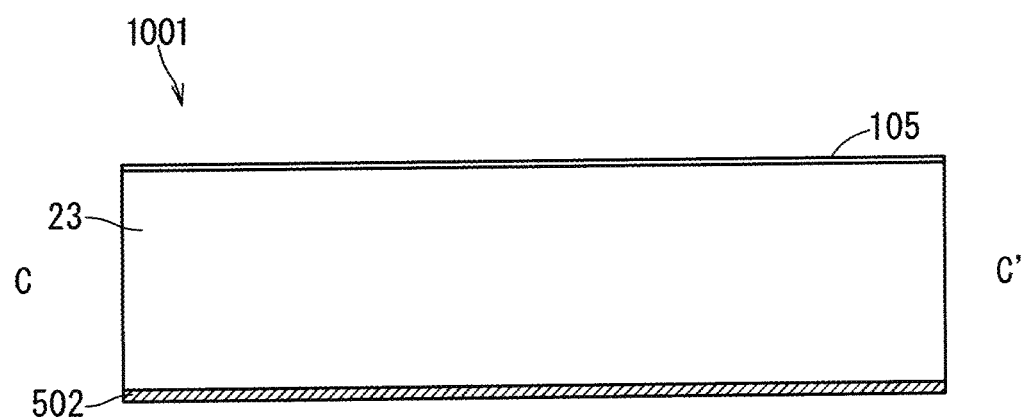
FIG. 5 is a cross-sectional view of the semiconductor device along the line C-C' of FIG. 2.

A semiconductor device pertaining to the present embodiment will be described below. FIG. 1 is a cross-sectional view of a semiconductor device 1001 in Embodiment 1. FIG. 2 is a top view of the semiconductor device 1001. FIG. 3 is a cross-sectional view of the semiconductor device 1001 along the line A-A' of FIG. 2. FIG. 4 is a cross-sectional view of the semiconductor device 1001 along the line B-B' of FIG. 2. FIG. 5 is a cross-sectional view of the semiconductor device 1001 along the line C-C' of FIG. 2. Although being different from FIG. 4 in dimensions of components of the semiconductor device 1001, FIG. 1 is a cross-sectional view through a source electrode 101 and a drain electrode 102 of the semiconductor device 1001 as with FIG. 4.

The semiconductor device 1001 includes a diamond substrate 23, epitaxial semiconductor layers 2 and 3, the source electrode 101, the drain electrode 102, a gate electrode 106, a surface protective film 105, a source pad 107, a drain pad 108, a source via hole 501, and a source via metal 502.

The diamond substrate 23 is formed of diamond, and has an upper surface 109 and a lower surface 503. The diamond substrate 23 has a protrusion 16 on a side of the upper surface 109. A portion indicated in FIG. 1 as a bonding interface 27 between the diamond substrate 23 and the epitaxial semiconductor layer 2 is a bottom surface of a recess 17 formed between two protrusions 16. A portion extending from the bottom surface of the recess 17 toward the upper surface 109 is the protrusion 16.

In plan view of the diamond substrate 23, the recess 17 and the protrusion 16 is adjacent to each other. In plan view of the diamond substrate 23, the recess 17 is desired to be surrounded on all sides by the protrusion 16, but may not be surrounded on all sides by the protrusion 16. For example, the recess 17 in the upper surface 109 may have a striped structure extending in a front-back direction on the page of FIG. 1, or may have a dot structure, a hole structure, or a pillar structure.

The epitaxial semiconductor layers 2 and 3 are stacked in this order within the recess 17 of the diamond substrate 23. Although the two epitaxial semiconductor layers are described herein, a single epitaxial semiconductor layer or three or more layers may be formed within the recess 17, or a stacked structure of fine epitaxial semiconductor layers of several tens of angstroms, such as a superlattice structure and an interfacial transition layer, may be formed within the recess 17.

A GaN based or an AlN based material (hereinafter, a nitride based semiconductor material) is used for the epitaxial semiconductor layers 2 and 3, for example. Alternatively, diamond, graphene, Si, Ge, GaAs, SiC, InP, ZnO, ZnSe, $Ga_2O_3$, or the like may be used for the epitaxial semiconductor layers 2 and 3, or a ternary or higher compound semiconductor, such as IGZO, may be used for the epitaxial semiconductor layers 2 and 3.

The semiconductor device 1001 includes a plurality of element regions 201 where semiconductor elements are formed and isolation regions 202 each located between two adjacent element regions 201 in plan view. The protrusion 16 of the diamond substrate 23 is located in an isolation region 202. In each of the element regions 201, a field-effect transistor is formed as a semiconductor element. The field-effect transistor herein refers to a lateral semiconductor device, such as a metal-insulator-semiconductor (MIS) field-effect transistor, a metal-oxide-semiconductor (MOS) field-effect transistor, a hetero junction field-effect transistor, a thin-film transistor (TFT), and a high electron mobility transistor (HEMT). In the present embodiment, an HEMT device is taken as an example of the field-effect transistor.

An upper surface 401 of the epitaxial semiconductor layer 3 is flush with the upper surface 109 of the protrusion 16 of the diamond substrate 23. The source electrode 101, the drain electrode 102, and the gate electrode 106 are partially formed on the upper surface 401 of the epitaxial semiconductor layer 3. These electrodes and the epitaxial semiconductor layers 2 and 3 constitute the HEMT device. The surface protective film 105 not only covers the upper surface 401 of the epitaxial semiconductor layer 3 but also partially covers the upper surface 109 of the protrusion 16. The gate electrode 106 may have any shape appropriate for the purpose of the present embodiment. A field plate electrode may be formed on an upper surface of the gate electrode 106. The field plate electrode may have any structure of a source field plate, a gate field plate, or the like.

The HEMT device may further include the source pad 107 and the drain pad 108. The source pad 107 partially covers an upper surface of the source electrode 101. The drain pad 108 partially covers an upper surface of the drain electrode 102.

The surface protective film 105 including at least one layer is formed in a region on the upper surface 401 of the epitaxial semiconductor layer 3 where the source electrode 101, the drain electrode 102, and the gate electrode 106 are not formed. The surface protective film 105 performs electric field control, surface potential control, surface level inactivation, water resisting, or moisture resisting functions. The gate electrode 106 may partially cover the surface protective film 105, or may not cover the surface protective film 105.

In a region of the diamond substrate 23 where the source electrode 101 is formed, the source via hole 501 extending through the diamond substrate 23 from the lower surface 503 to the upper surface 109 is formed. The source via hole 501 tapers to decrease in inner diameter from the lower surface 503 to the upper surface 109 in FIG. 1, but may have a reverse-taper shape or may not taper.

The lower surface 503 of the diamond substrate 23 is covered with the source via metal 502. As illustrated in FIG. 1, the source via metal 502 covers an inner wall of the source via hole 501, and is in contact with the source electrode 101 and the diamond substrate 23 to form interfaces.

A-2. Effects

The semiconductor device 1001 includes the diamond substrate 23, the epitaxial semiconductor layers 2 and 3 as a nitride semiconductor layer, and the source electrode 101, the drain electrode 102, and the gate electrode 106 as an electrode disposed on the nitride semiconductor layer. The diamond substrate 23 has the recess 17 in the upper surface 109 thereof, and the nitride semiconductor layer is disposed within the recess 17. The source electrode 101, the drain electrode 102, and the gate electrode 106 are arranged on the nitride semiconductor layer, and these electrodes and the nitride semiconductor layer constitute the field-effect transistor. The nitride semiconductor layer herein corresponds to at least one of the epitaxial semiconductor layers 2 and 3.

According to such a configuration, diamond having high thermal conductivity is formed to be in contact with not only a lower surface but also a side surface of the nitride semiconductor layer. Thus, when an element structure or the like is formed on an upper surface of the nitride semiconductor layer so that the semiconductor device including the nitride semiconductor layer is a heat source, high heat dissipation performance can be provided not only to a location below the semiconductor device but also to the sides of the semiconductor device. An increase in temperature of the semiconductor device can thereby substantially be suppressed. The epitaxial semiconductor layer 2 and the diamond substrate 23 are in direct contact with each other to form the bonding interface 27, so that thermal resistance at the bonding interface 27 is low. Thus, heat can efficiently be dissipated from the epitaxial semiconductor layer 2 to the diamond substrate 23 below the epitaxial semiconductor layer 2.

Furthermore, the diamond substrate 23 has the source via hole 501 extending through the thickness of the diamond substrate 23 to expose the source electrode 101. The semiconductor device 1001 further includes the source via metal 502 covering the inner wall of the source via hole 501 and the lower surface of the diamond substrate 23. Such a configuration eliminates the need for wiring for source grounding, so that an amplification factor of a high-frequency signal is not reduced due to no need for wiring, and high high-frequency properties can be obtained. A via hole and a via metal are typically factors for reduction in heat dissipation, and there is a trade-off between heat transport properties and high-frequency properties. According to the configuration of the semiconductor device 1001, however, the source via hole 501 is adjacent to the diamond substrate 23 through the source via metal 502. High high-frequency properties and high heat transport properties can thus be obtained simultaneously by breaking the trade-off between heat transport properties and high-frequency properties.

In the semiconductor device 1001, an entire periphery of the recess 17 of the diamond substrate 23 is desired to be surrounded by the protrusion 16 in plan view. The protrusion 16 is the portion of the diamond substrate 23 extending from the bottom surface of the recess 17 along the height of the recess 17. Heat dissipation performance of dissipating heat generated in the nitride semiconductor layer to the sides of the recess 17 is improved by this configuration.

In the semiconductor device 1001, the upper surface 109 of the diamond substrate 23 and the upper surface 401 of the epitaxial semiconductor layer 3 forming the nitride semiconductor layer are desired to be flush with each other. According to such a configuration, all sides of the nitride semiconductor layer can be covered with the diamond substrate 23, so that heat dissipation performance of dissipating heat generated in the nitride semiconductor layer to the sides of the recess 17 is improved.

An isolation step is typically necessary in manufacturing the HEMT device. A method of physically causing a two-dimensional electron gas to be a carrier to disappear by a dry etching process, a method of physically breaking an epitaxial semiconductor crystal in a region corresponding to the isolation region by a selective ion implantation process, or the like is typically used in the isolation step. When the diamond substrate 23 has a higher electrical resistivity, that is, higher electrical insulation than the nitride semiconductor layer in the semiconductor device 1001, however, the protrusion 16 of the diamond substrate 23 provides an isolation function. A complicated isolation step can thereby be simplified.

B. Embodiment 2

B-1. Configuration

FIG. 6 is a cross-sectional view of a semiconductor device 1002 in Embodiment 2. Although the epitaxial semiconductor layer 2 and the diamond substrate 23 are in direct contact with each other in the semiconductor device 1001 as illustrated in FIG. 1, an intervening layer 19 is disposed between the epitaxial semiconductor layer 2 and the diamond substrate 23 in the semiconductor device 1002 in Embodiment 2. That is to say, the semiconductor device 1002 includes the intervening layer 19 in addition to the configuration of the semiconductor device 1001 in Embodiment 1, and a configuration other than the intervening layer 19 is similar to that of the semiconductor device 1001. The intervening layer 19 is formed to cover the upper surface 109 of the protrusion 16 and an inner wall of the recess 17 of the diamond substrate 23.

The diamond substrate 23 is in direct contact with the intervening layer 19 to form a bonding interface 26. The epitaxial semiconductor layer 2 is in direct contact with the intervening layer 19 to form a bonding interface 22.

A typical material for the intervening layer 19 is an amorphous material, such as amorphous silicon and silicon nitride, for example, but the intervening layer 19 may be formed of any crystalline material having order and excellent heat transport properties. When the epitaxial semiconductor layer 2 is grown within the recess 17 of the diamond substrate 23, diamond nanoparticles referred to as diamond seeds may be used as the material for the intervening layer 19. The intervening layer 19 is desired to have a thickness of 50 nm or less, for example, in view of heat dissipation efficiency.

B-2. Effects

The semiconductor device 1002 in Embodiment 2 includes the intervening layer 19 between the diamond substrate 23 and the epitaxial semiconductor layer 2 as the nitride semiconductor layer. Thus, according to the semiconductor device 1002, the effects obtained in Embodiment 1 can also be obtained, and, further, the occurrence of film separation or a defect, cracking, or the like between the diamond substrate 23 and the epitaxial semiconductor layer 2 can be suppressed to improve adhesion in bonding.

More specifically, the intervening layer 19 is formed on the inner wall of the recess 17 of the diamond substrate 23. The epitaxial semiconductor layers 2 and 3 are formed within the recess 17 of the diamond substrate 23 through the intervening layer 19. According to such a configuration, when a diamond layer covering the epitaxial semiconductor layers 2 and 3 is formed after formation of the epitaxial semiconductor layers 2 and 3, a defect or damage of the epitaxial semiconductor layers 2 and 3 can be suppressed while adhesion of the epitaxial semiconductor layers 2 and 3 to the diamond layer is increased.

C. Embodiment 3

C-1. Configuration

FIG. 7 is a cross-sectional view of a semiconductor device 1003 in Embodiment 3. In the semiconductor device 1003, the source via hole 501 is filled with a source via filler 504. That is to say, the semiconductor device 1003 includes the source via filler 504 in addition to the configuration of the semiconductor device 1002 in Embodiment 2, and a configuration other than the source via filler 504 is similar to that of the semiconductor device 1002.

The source via filler 504 is desired to be formed of a material having high thermal conductivity, such as diamond, diamond-like carbon, and graphite, for example. The material for the source via filler 504 is not limited to an inorganic material, may be any organic material having high thermal conductivity, and may be a mixture of the inorganic material and the organic material.

After the inner wall of the source via hole 501 is covered with the source via metal 502, the source via hole 501 is filled with the source via filler 504. The source via filler 504 may be flush with the lower surface 503 of the diamond substrate 23, or may be flush with the source via metal 502 formed on the lower surface 503.

C-2. Effects

In the semiconductor device 1003 in Embodiment 3, the source via filler 504 is formed within the source via hole 501. The source via filler 504 is desired to be diamond. According to such a configuration, the source via metal 502 is in contact with not only the diamond substrate 23 but also diamond of the source via filler 504. The semiconductor device 1003 can thus be highly heat dissipating.

D. Embodiment 4

D-1. Configuration

A monolithic microwave integrated circuit (MMIC) for use in a microwave communication system or a millimeter wave communication system includes an HEMT device. As an HEMT device for use in a high-power power amplifier of the MMIC, a multi-finger HEMT in which a plurality of unit HEMTs are electrically connected in parallel is used. In the multi-finger HEMT, each of the unit HEMTs connected in parallel generates a non-negligible amount of heat. In particular, a unit HEMT device located at or around the center of the multi-finger HEMT has poor heat dissipation efficiency as heat is concentrated on the unit HEMT device by being affected by heat generation of unit HEMT devices located around the unit HEMT device. As a result, the unit HEMT device located at or around the center of the multi-finger HEMT is likely to be broken. A structure having high heat dissipation efficiency is thus required to be used to improve performance of the multi-finger HEMT in the high-power power amplifier.

Figure 8:
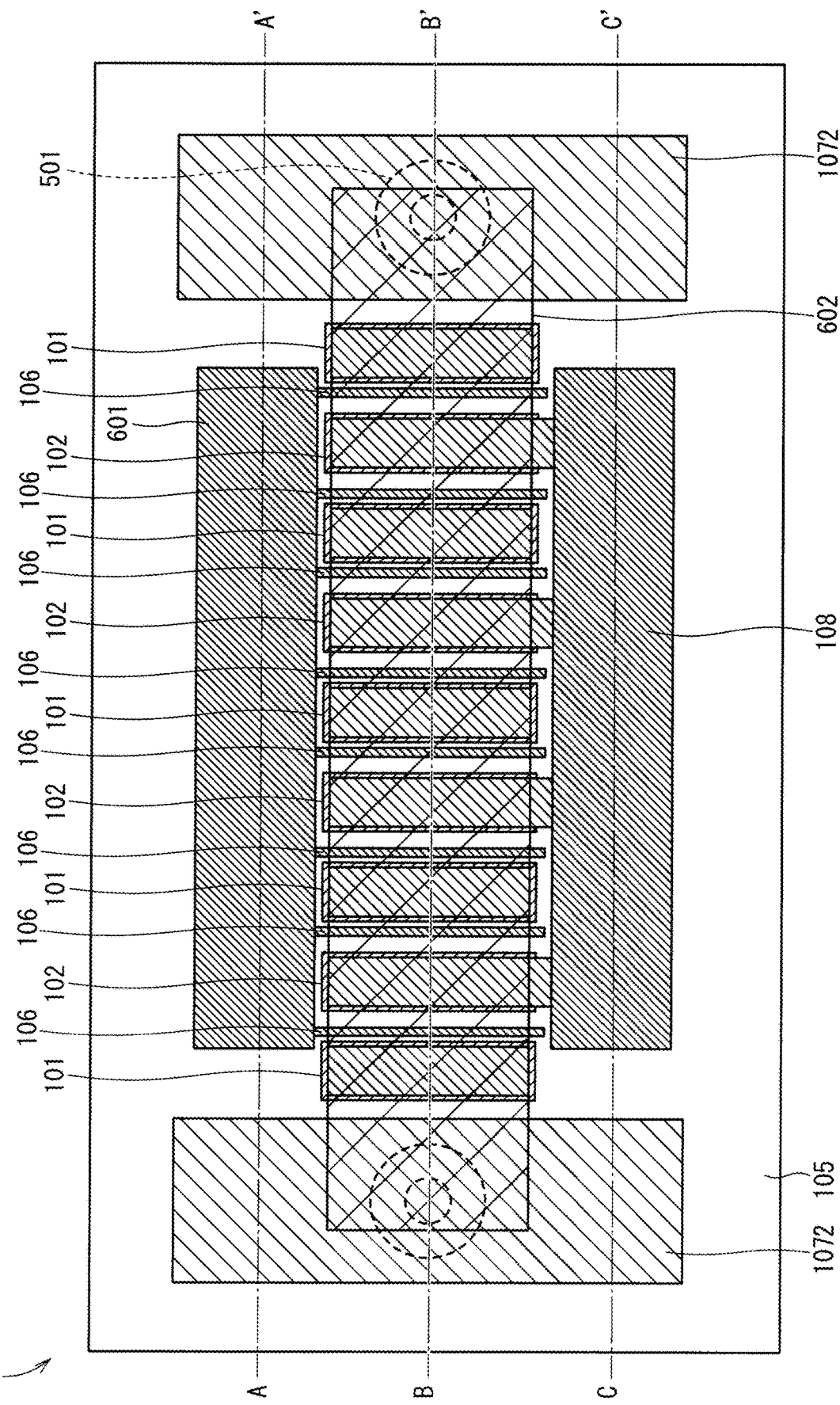
FIG. 8 is a top view of a semiconductor device in Embodiment 4.
Figure 9:
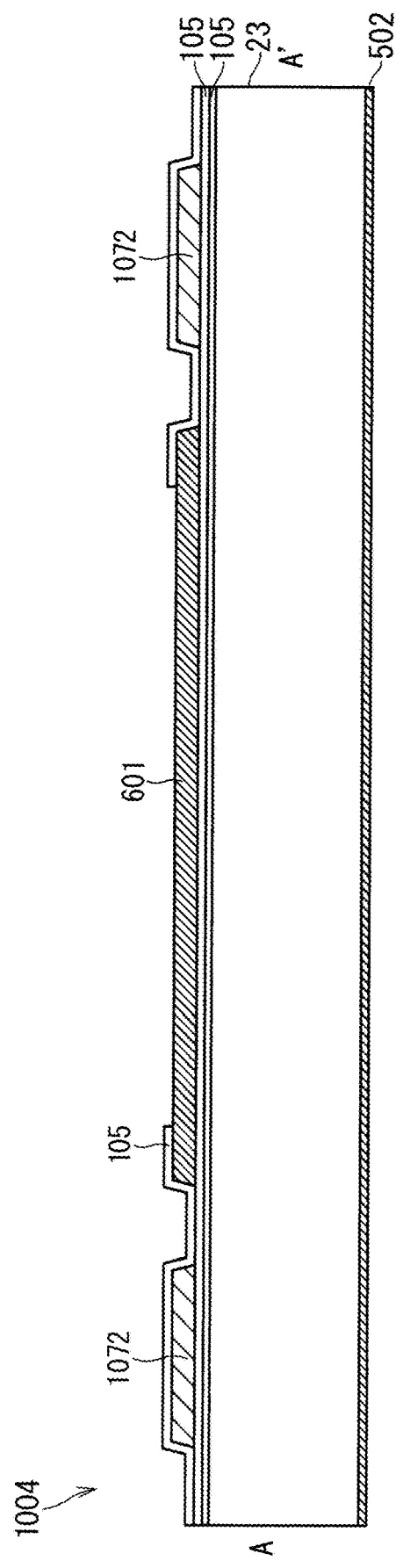
FIG. 9 is a cross-sectional view of the semiconductor device along the line A-A' of FIG. 8.
Figure 10:
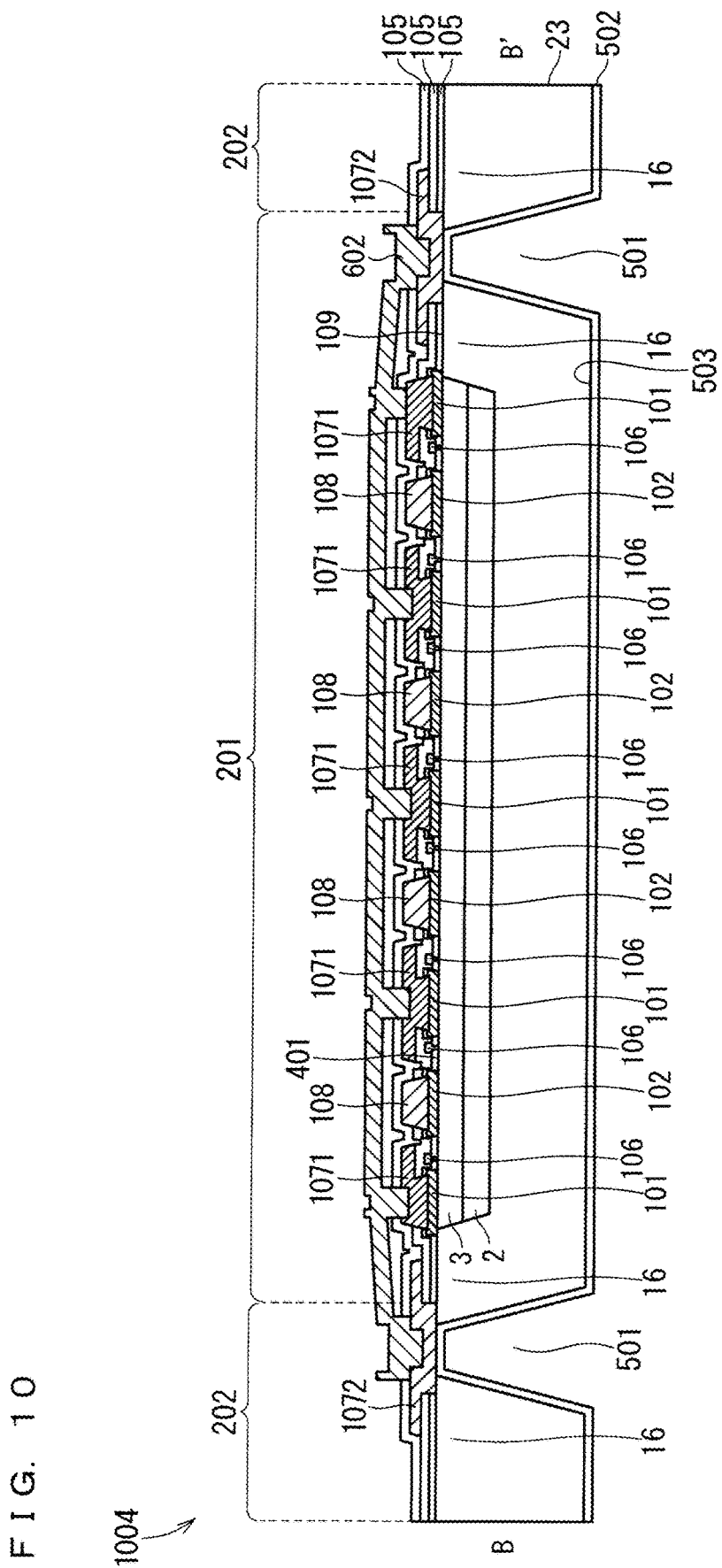
FIG. 10 is a cross-sectional view of the semiconductor device along the line B-B' of FIG. 8.
Figure 11:
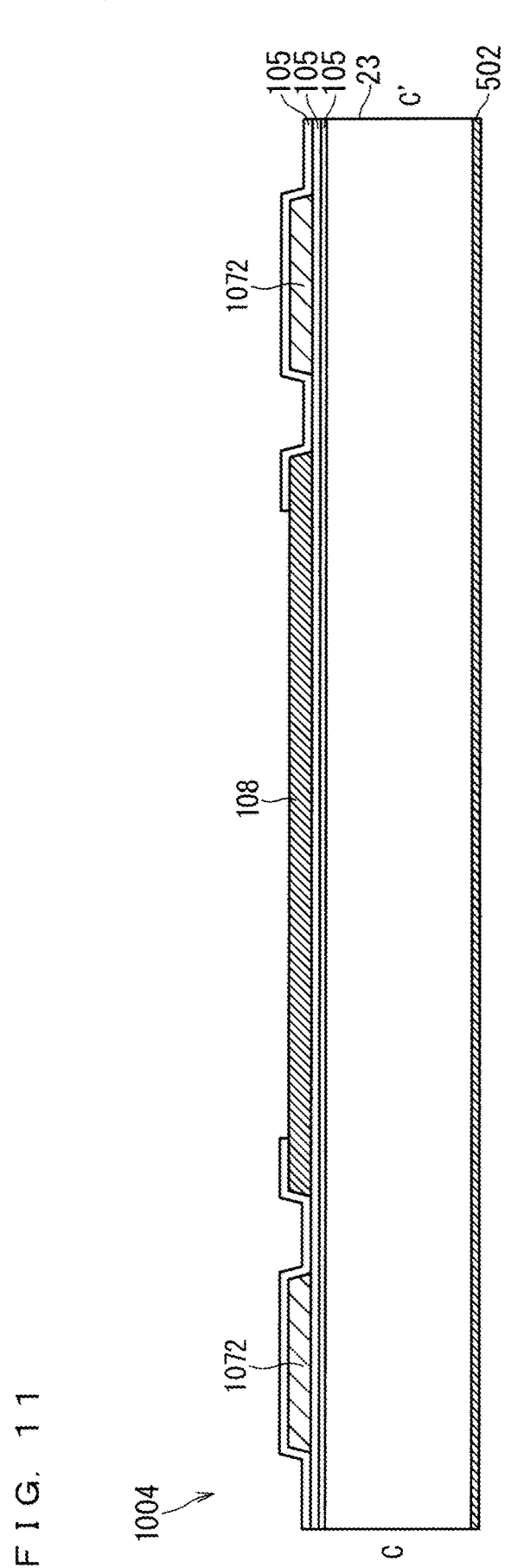
FIG. 11 is a cross-sectional view of the semiconductor device along the line C-C' of FIG. 8.

FIG. 8 is a top view of a semiconductor device 1004 in Embodiment 4. FIG. 9 is a cross-sectional view of the semiconductor device 1004 along the line A-A' of FIG. 8. FIG. 10 is a cross-sectional view of the semiconductor device 1004 along the line B-B' of FIG. 8. FIG. 11 is a cross-sectional view of the semiconductor device 1004 along the line C-C' of FIG. 8. The semiconductor device 1004 includes, in each of the element regions 201, a multi-finger field-effect transistor in which a plurality of field-effect transistors are electrically connected in parallel. The unit field-effect transistors connected in parallel may herein be MIS, MOS, or HEMT devices, for example. A multi-finger HEMT is herein taken as an example.

The semiconductor device 1004 includes the diamond substrate 23, the epitaxial semiconductor layers 2 and 3, source electrodes 101, drain electrodes 102, gate electrodes 106, the surface protective film 105, first source pads 1071, second source pads 1072, the drain pad 108, the source via hole 501, and the source via metal 502.

In the semiconductor device 1004, the diamond substrate 23 has the protrusion 16 on the side of the upper surface 109, and the epitaxial semiconductor layers 2 and 3 are formed within the recess 17 as in the semiconductor device 1001 in Embodiment 1. The source electrodes 101, the drain electrodes 102, and the gate electrodes 106 are partially formed on the upper surface 401 of the epitaxial semiconductor layer 3. A single source electrode 101, a single drain electrode 102, a single gate electrode 106, and the epitaxial semiconductor layers 2 and 3 constitute a unit HEMT device.

The unit HEMT device may further include a first source pad 1071 and the drain pad 108. The first source pad 1071 partially covers an upper surface of the source electrode 101. The drain pad 108 partially covers an upper surface of the drain electrode 102.

In each of the element regions 201 of the semiconductor device 1004, a plurality of unit HEMT devices are formed, and the plurality of unit HEMT devices are electrically connected in parallel to constitute a multi-finger HEMT device. Specifically, the first source pads 1071 are connected to each other through a source air bridge 602, and are connected to the second source pads 1072. The second source pads 1072 are formed on the upper surface 109 of the diamond substrate 23. In a region of the diamond substrate 23 where each of the second source pads 1072 is formed, the source via hole 501 extending through the diamond substrate 23 from the lower surface 503 to the upper surface 109 is formed. The drain electrodes 102 are connected by the drain pad 108. The gate electrodes 106 are connected by a gate pad 601.

The source air bridge 602 is source wiring having a bridge pier structure to connect two source electrodes 101 in midair. The source wiring, however, may be formed on the surface of the device as with the drain pad 108 or the gate pad 601. The source air bridge 602 can eliminate the influence of parasitic capacitance as an interlayer dielectric is air. The source air bridge 602 is achieved using a plated wiring process.

The gate electrodes 106 may each have any shape appropriate for the purpose of the present embodiment. The field plate electrode may be formed on an upper surface of each of the gate electrodes 106. The number of unit HEMT devices connected in parallel in the multi-finger HEMT is not limited.

D-2. Modification

FIG. 10 illustrates a configuration in which the diamond substrate 23 and the epitaxial semiconductor layer 2 are in direct contact with each other. However, the intervening layer 19 may be disposed between the epitaxial semiconductor layer 2 and the diamond substrate 23 in the semiconductor device 1004 as in the semiconductor device 1002 in Embodiment 2. Effects similar to those obtained in Embodiment 2 can thereby be obtained.

D-3. Effects

According to such a configuration of the semiconductor device 1004, the diamond substrate 23 formed of a material having high thermal conductivity is adjacent to the sides of the epitaxial semiconductor layers 2 and 3 in an active region of the multi-finger field-effect transistor in plan view. Heat generated by the epitaxial semiconductor layers 2 and 3 can thus efficiently be dissipated. Effects similar to those obtained in Embodiment 1 can also be obtained.

E. Embodiment 5

E-1. Configuration

Figure 12:
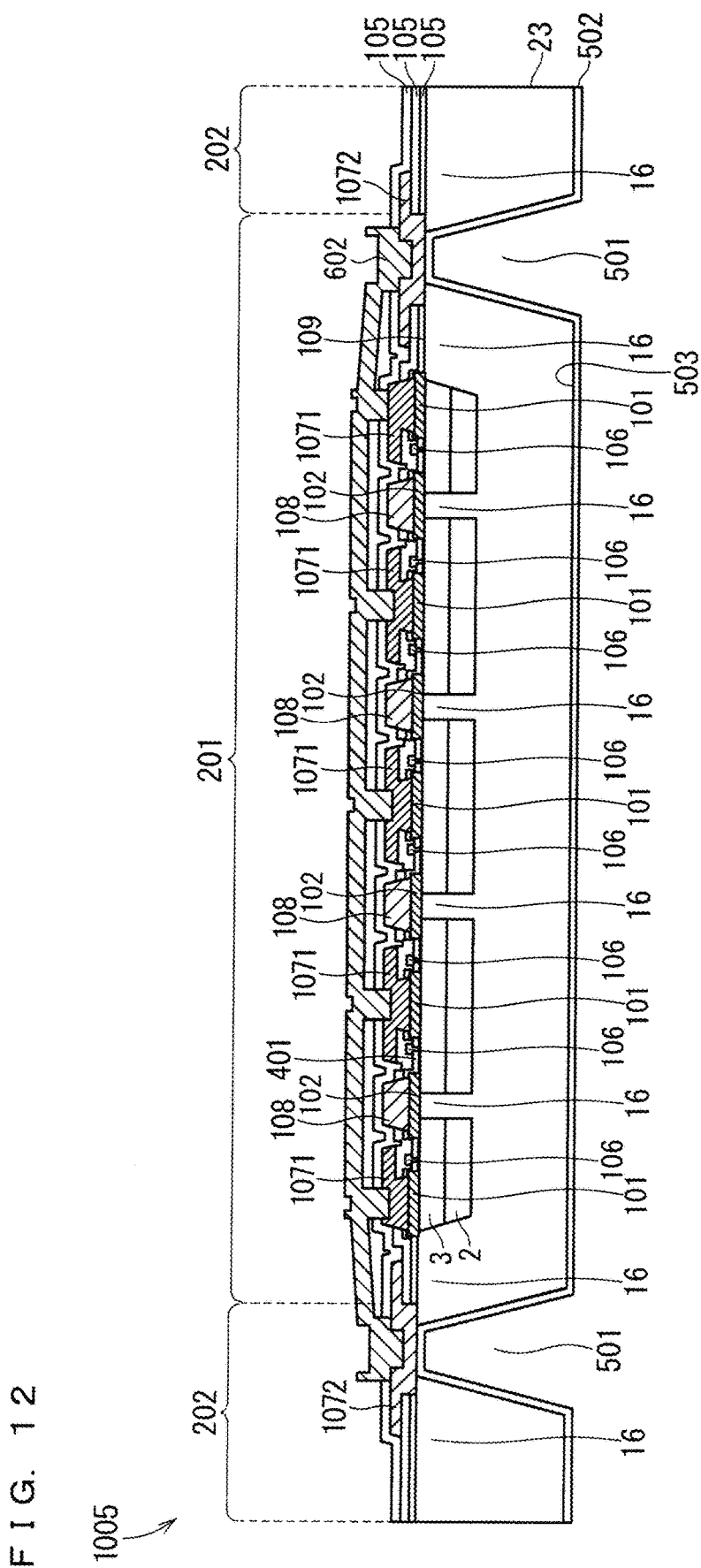
FIG. 12 is a cross-sectional view of a semiconductor device in Embodiment 5.

A top view of a semiconductor device in Embodiment 5 is similar to the top view of the semiconductor device 1004 in Embodiment 4 illustrated in FIG. 8. FIG. 12 is a cross-sectional view of a semiconductor device 1005 along the line B-B' of FIG. 8.

As illustrated in FIG. 10, the semiconductor device 1004 in Embodiment 4 includes, for each multi-finger HEMT, a single recess 17 in an element region 201 and a single protrusion 16 in an isolation region 202. In contrast, the semiconductor device 1005 includes a plurality of recesses 17 in an element region 201 and a protrusion 16 between two adjacent recesses 17. Protrusions 16 of the diamond substrate 23 in the element region 201 are each located directly below a source electrode 101 or a drain electrode 102.

The protrusions 16 are formed directly below the drain electrodes 102 in FIG. 12. A configuration of the semiconductor device 1005 other than the protrusions 16 is similar to that of the semiconductor device 1004.

E-2. Effects

According to the semiconductor device 1005 in Embodiment 5, the plurality of recesses 17 are formed in the upper surface 109 of the diamond substrate 23. The source electrode 101 or the drain electrode 102 is located on the protrusion 16 between two adjacent recesses 17. With such a configuration, the epitaxial semiconductor layers 2 and 3 to be active layers of the multi-finger HEMT are surrounded by the protrusions 16 of the diamond substrate 23 at a close distance in plan view. Heat generated by the epitaxial semiconductor layers 2 and 3 can thus efficiently be dissipated to the diamond substrate 23.

F. Embodiment 6

F-1. Configuration

Figure 13:
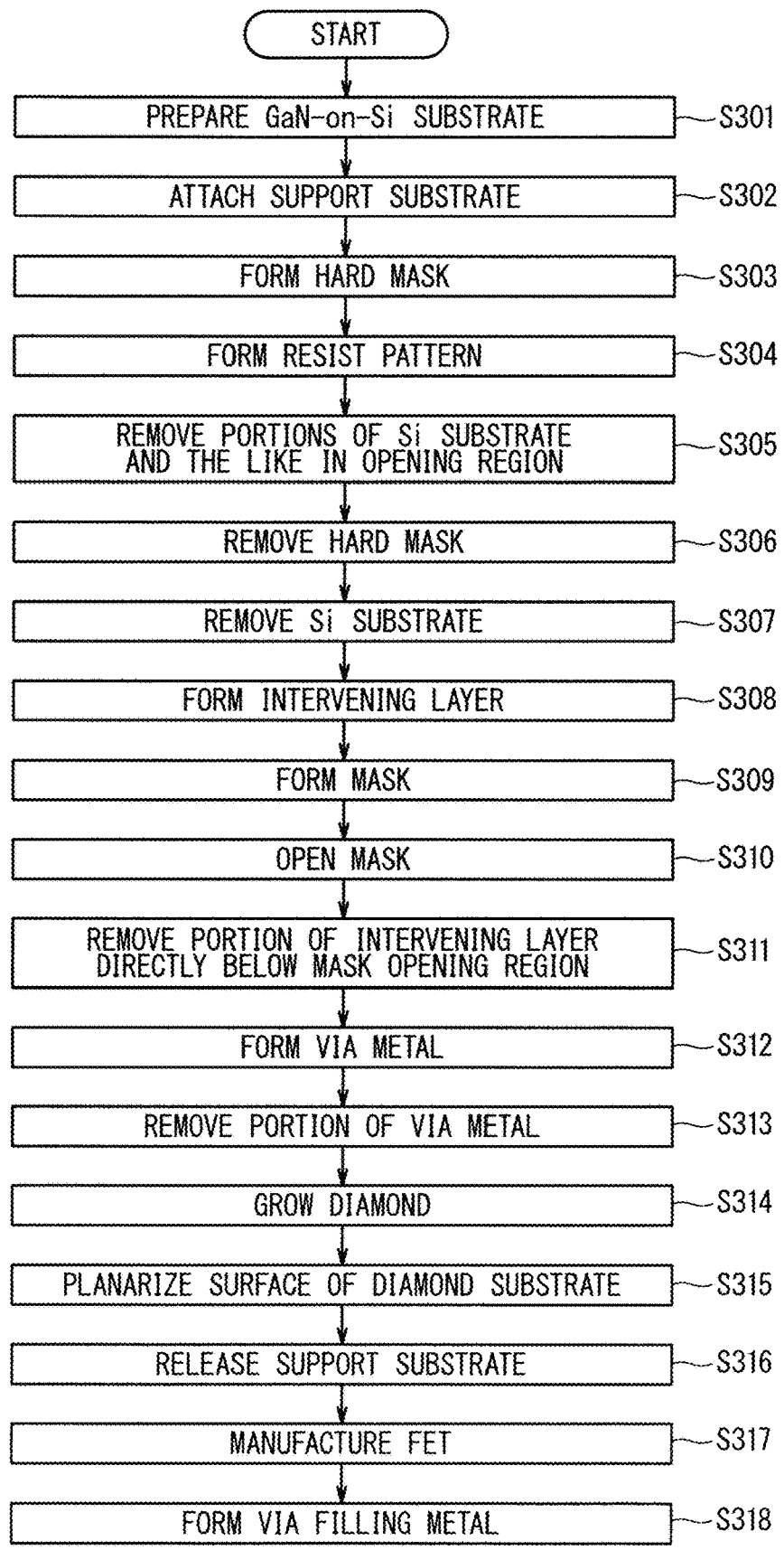
FIG. 13 is a flowchart showing a first semiconductor device manufacturing method.
Figure 32:
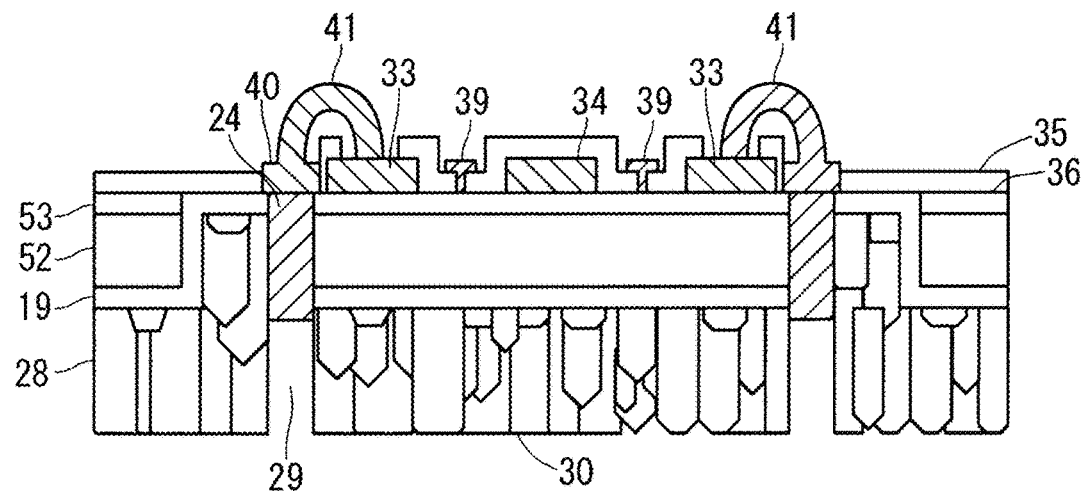
FIG. 32 is a cross-sectional view illustrating the first semiconductor device manufacturing method.
Figure 33:
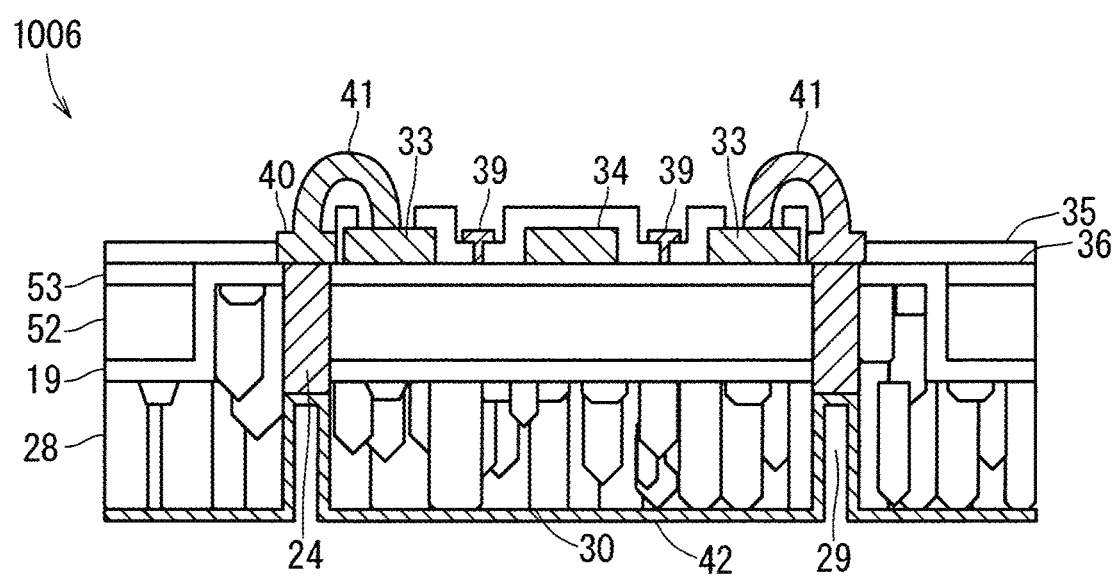
FIG. 33 is a cross-sectional view illustrating the first semiconductor device manufacturing method.

FIG. 13 is a flowchart showing a method of manufacturing a semiconductor device 1006 in Embodiment 6. FIGS. 14 to 33 are cross-sectional views for illustrating the method of manufacturing the semiconductor device 1006. The semiconductor device 1006, whose cross-sectional view is illustrated in FIG. 33, has the nitride semiconductor layer within the recess of the diamond substrate, the source via hole, and the source via metal in common with the semiconductor devices 1001 to 1005 in Embodiments 1 to 5. While the method of manufacturing the semiconductor device 1006 will be described below, this method corresponds to a first method of manufacturing the semiconductor devices 1001 to 1005 in Embodiments 1 to 5.

Figure 14:
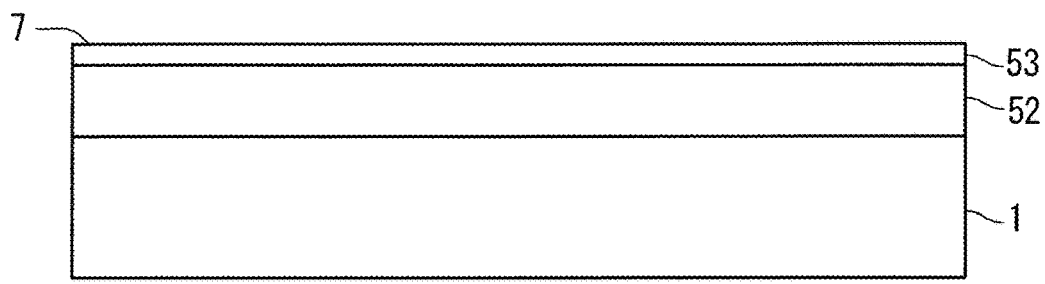
FIG. 14 is a cross-sectional view illustrating the first semiconductor device manufacturing method.

First, a GaN-on-Si substrate is prepared as a starting substrate for manufacturing processing as illustrated in FIG. 14 (step S301). The GaN-on-Si substrate is a substrate in which a GaN layer 52 and an AlGaN layer 53 have been stacked in the stated order on an upper surface of an Si substrate 1 as a semiconductor substrate. The GaN layer 52 and the AlGaN layer 53 herein respectively correspond to the epitaxial semiconductor layer 2 and the epitaxial semiconductor layer 3 in Embodiments 1 to 5. A substrate, such as a GaN-on-sapphire substrate and a GaN-on-SiC substrate, in which GaN has heteroepitaxially been grown on a different substrate material may be used as the starting substrate.

Figure 15:
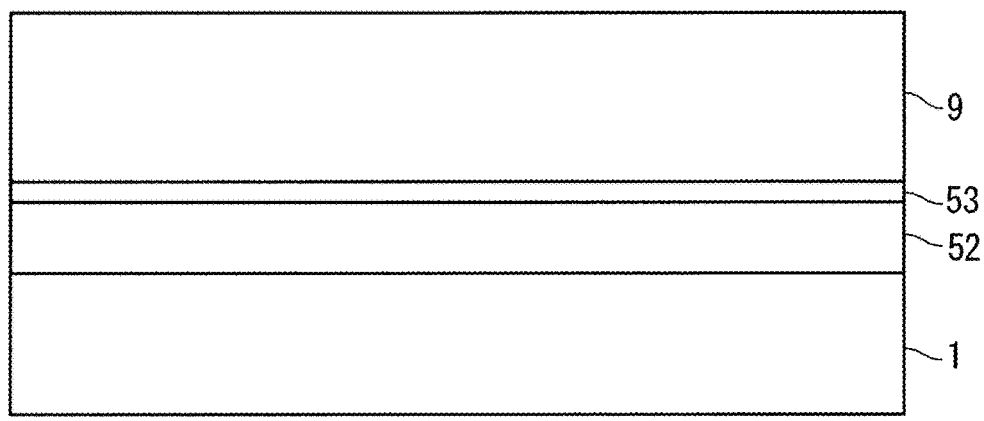
FIG. 15 is a cross-sectional view illustrating the first semiconductor device manufacturing method.

A support substrate 9 is then attached to a surface 7 of the AlGaN layer 53 as illustrated in FIG. 15 (step S302). The surface 7 is a first main surface of the AlGaN layer 53 opposite the Si substrate 1. An Si substrate, a sapphire substrate, a quartz substrate, or the like is used herein as the support substrate 9.

The surface 7 of the AlGaN layer 53 is desired to be planarized in advance to have arithmetic mean roughness (Ra) of 30 nm or less. The same applies to the support substrate 9.

The support substrate 9 may be attached to the surface 7 of the AlGaN layer 53 by bonding, such as hydrophilic bonding, pressure bonding, and plasma activated bonding, or adherence using an inorganic adhesive material and the like, for example. Any interlayer film may be provided on a bonding surface between the support substrate 9 and the AlGaN layer 53. The interlayer film is desired to be formed of a material, such as silicon nitride and an alumina film, typically used as a surface protective film not contaminating a semiconductor surface. However, a material contaminating the semiconductor surface may be used for the interlayer film when contamination on the semiconductor surface is removed in a later device manufacturing step. A composite substrate in which the support substrate 9 and the surface 7 of the AlGaN layer 53 have been bonded is manufactured as described above.

Figure 16:
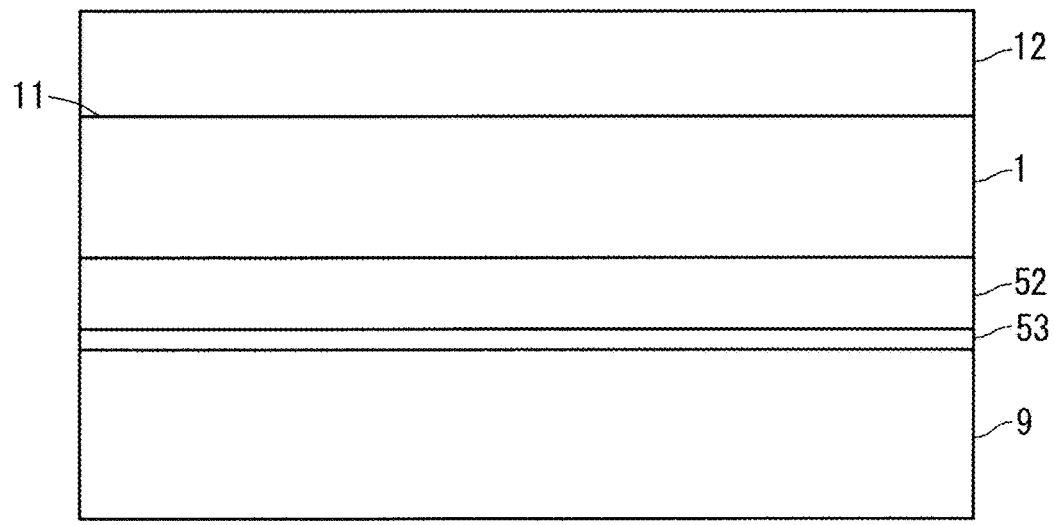
FIG. 16 is a cross-sectional view illustrating the first semiconductor device manufacturing method.

A hard mask 12 is then formed on a surface 11 of the Si substrate 1 opposite the GaN layer 52 as illustrated in FIG. 16 (step S303). The hard mask 12 is desired to be formed of a material resistant to dry etching and having an etching selectivity ratio to Si or GaN. The hard mask 12 may be formed of silicon nitride, an alumina film, silicon dioxide, or the like, for example. The hard mask 12 may be formed by physical vapor deposition (PVD), such as sputtering and evaporation, or chemical vapor deposition (CVD), such as low pressure chemical vapor deposition, plasma enhanced chemical vapor deposition, and atomic layer deposition, for example. Not a single layer but two or more layers may be formed as the hard mask 12 in accordance with each selectivity ratio in a step of forming a through groove 44 in or after step S304.

A resist pattern for forming the through groove 44 is then formed on the hard mask 12 (step S304). The resist pattern is required to be formed to surround a region of formation of each of the element regions 201 on all sides in plan view. Photolithography technology is used as a method of forming the resist pattern, for example. The hard mask 12 is exposed to an external environment in a region corresponding to an opening of the resist pattern, and is protected by the resist pattern in the other region.

Figure 17:
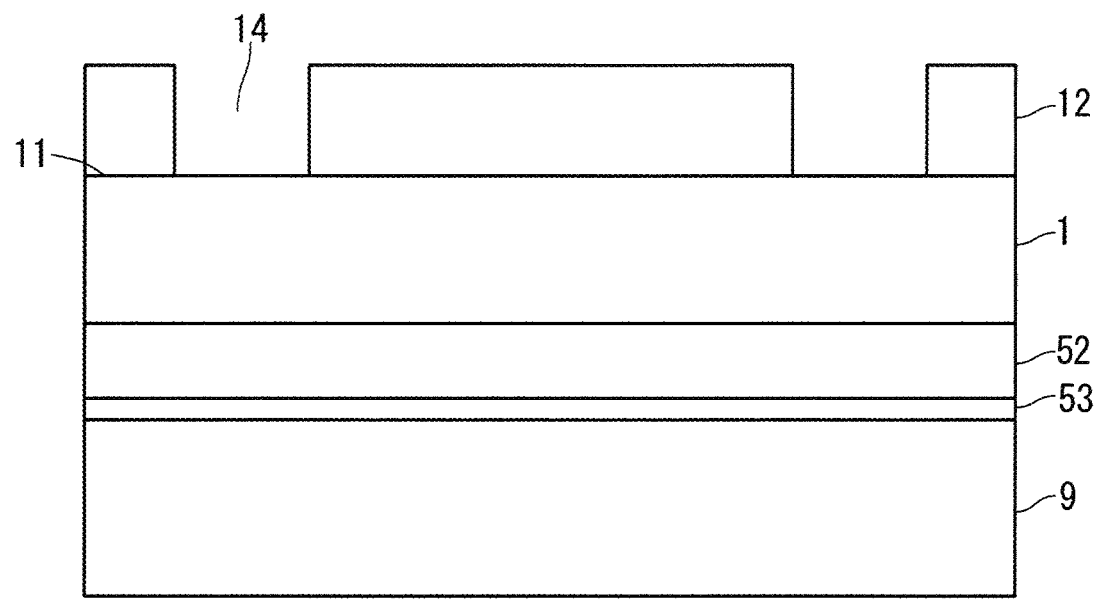
FIG. 17 is a cross-sectional view illustrating the first semiconductor device manufacturing method.

The region of the hard mask 12 corresponding to the opening of the resist pattern and exposed to the external environment is then removed by development of the resist as illustrated in FIG. 17. The region of the hard mask 12 is removed by wet etching through immersion in a chemical solution or dry etching, for example. A method by which the etching selectivity ratio can be earned is herein desired to be used. An opening of the hard mask 12 thus formed is referred to as an opening region 14.

The surface 11 of the Si substrate 1 is exposed to the external environment in the opening region 14 of the hard mask 12. The resist pattern is then separated from the hard mask 12 to expose the hard mask 12 to the external environment.

Figure 18:
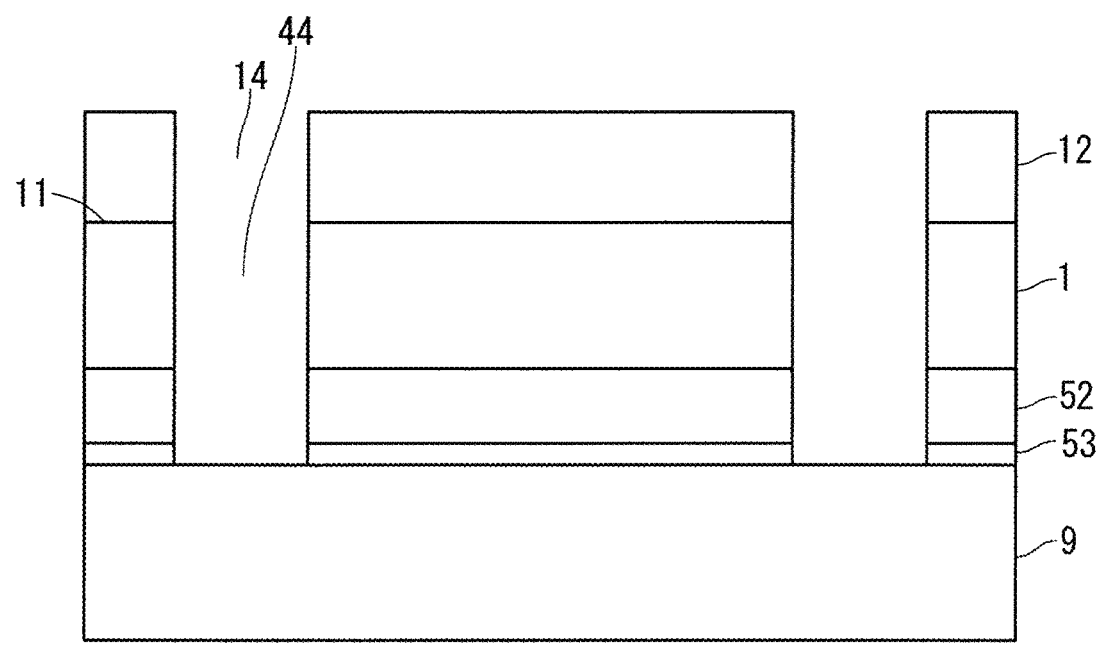
FIG. 18 is a cross-sectional view illustrating the first semiconductor device manufacturing method.

Portions of the Si substrate 1, the GaN layer 52, and the AlGaN layer 53 directly below the opening region 14 of the hard mask 12 are then removed as illustrated in FIG. 18 (step S305). In this step, a portion of the Si substrate 1 directly below the opening region 14 exposed to the external environment is removed first. The removed portion of the Si substrate 1 herein has a thickness of a few hundred micrometers, for example. After removal of the portion of the Si substrate 1, a portion of the GaN layer 52 directly below the opening region 14 is exposed to the external environment, and is removed. The removed portion of the GaN layer 52 herein has a thickness of a few micrometers or more and a few tens of micrometers or less, for example. After removal of the portion of the GaN layer 52, a portion of the AlGaN layer 53 directly below the opening region 14 is exposed to the external environment, and is removed. The removed portion of the AlGaN layer 53 herein has a thickness of approximately a few tens of nanometers, for example.

Selective etching of the GaN layer 52 and selective etching of the AlGaN layer 53 may be performed in the same step, or may separately be performed in different steps. It is important to selectively etch only a portion directly below the opening region 14.

After removal of the portion of the AlGaN layer 53 directly below the opening region 14, a surface of the support substrate 9 bonded to the AlGaN layer 53 is exposed to the external environment in the opening region 14. On the other hand, complete removal of a portion of the hard mask 12 other than the opening region 14 is not allowed throughout step S305.

By removing the portions of the Si substrate 1, the GaN layer 52, and the AlGaN layer 53 directly below the opening region 14 in step S305, the through groove 44 is formed. The through groove 44 extends through the thicknesses of the Si substrate 1, the GaN layer 52, and the AlGaN layer 53. A characteristic structure of the semiconductor devices 1001 to 1005 in Embodiments 1 to 5, that is, a structure in which the nitride semiconductor layer is formed within the recess of the diamond substrate is obtained by the through groove 44. Furthermore, the through groove 44 can relieve stress to suppress the occurrence of cracking or breakage of the GaN layer 52 or the AlGaN layer 53 in a step of removing the Si substrate 1.

Figure 19:
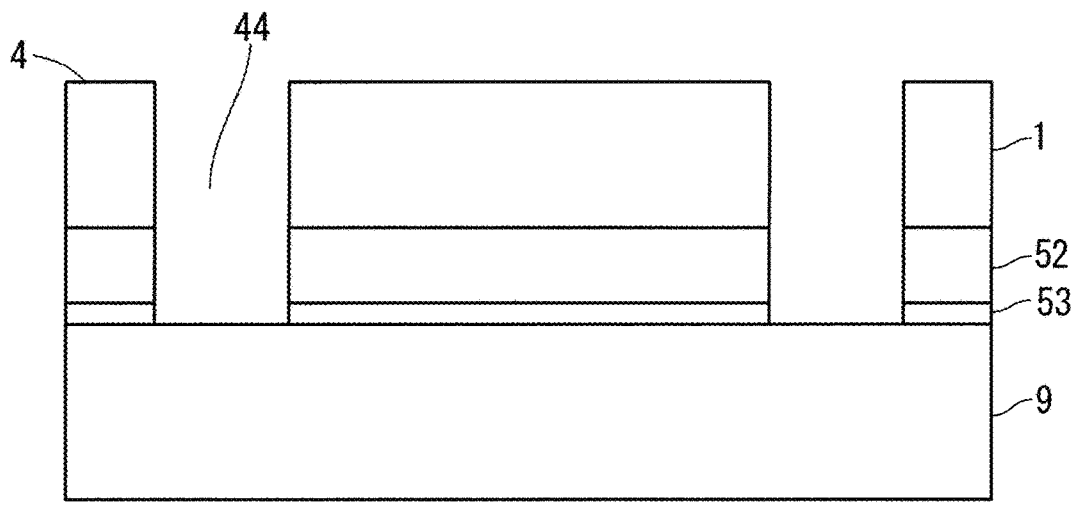
FIG. 19 is a cross-sectional view illustrating the first semiconductor device manufacturing method.

The hard mask 12 is then removed from the surface 11 of the Si substrate 1 as illustrated in FIG. 19 (step S306). There are the AlGaN layer 53, the GaN layer 52, and the Si substrate 1 on sides of the through groove 44. The hard mask 12 is thus desired to be removed by dry etching having anisotropy in a direction of progress of etching to suppress progress of etching to the sides of the through groove 44. The Si substrate 1 like islands is exposed to the external environment by removing the hard mask 12.

Figure 20:
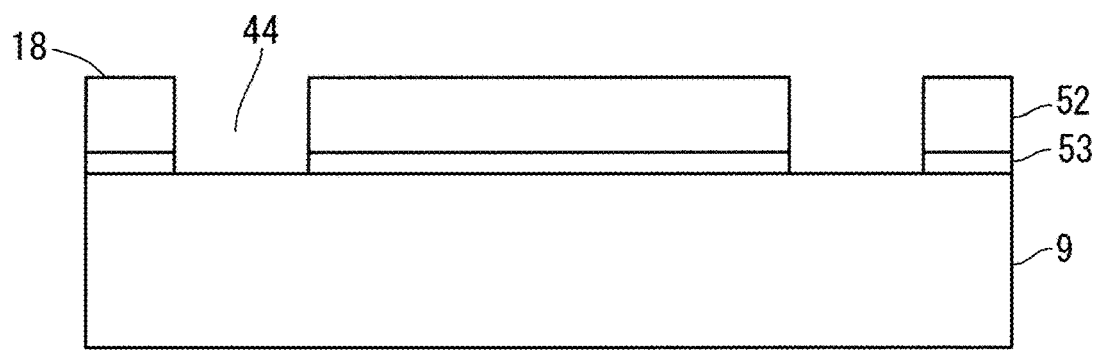
FIG. 20 is a cross-sectional view illustrating the first semiconductor device manufacturing method.

The Si substrate 1 as a whole is then removed as illustrated in FIG. 20 (step S307). After removal of the Si substrate 1, the GaN layer 52 is exposed to the external environment. A surface 18 of the GaN layer 52 may herein be planarized by chemical mechanical polishing (CMP), mechanical polishing, or other planarization processing. The surface 18 is a main surface of the nitride semiconductor layer opposite the first main surface.

Figure 21:
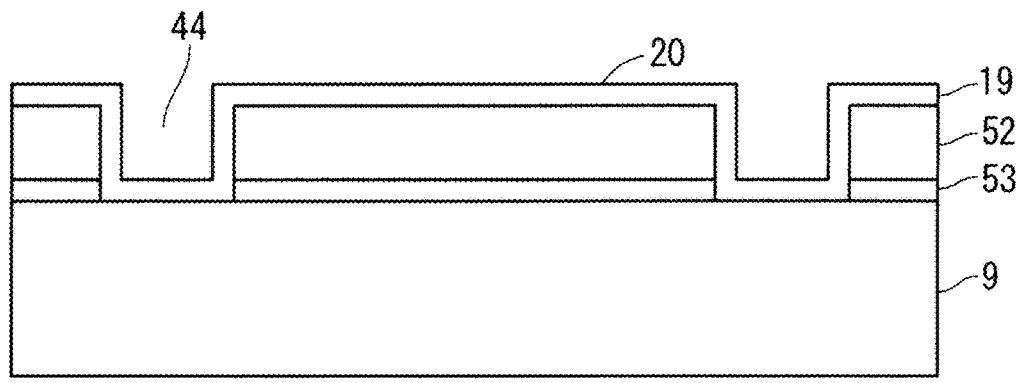
FIG. 21 is a cross-sectional view illustrating the first semiconductor device manufacturing method.

The intervening layer 19 is then formed on the surface 18 of the GaN layer 52 and an inner wall of the through groove 44 as illustrated in FIG. 21 (step S308). This step is omitted when a semiconductor device not including the intervening layer 19, such as the semiconductor device 1001 in Embodiment 1, is manufactured. The intervening layer 19 is formed to improve adhesion of the diamond substrate to the GaN layer 52 and protect the GaN layer 52 or the AlGaN layer 53 when the diamond substrate is grown or bonded in later step S314.

For the intervening layer 19, an amorphous material, such as amorphous silicon and silicon nitride, is typically used, but diamond nanoparticles, diamond-like carbon, graphene, graphite, or the like having excellent thermal conductivity may be used, for example. The intervening layer 19 is required to be formed to cover the inner wall of the through groove 44. In this case, a surface 20 of the intervening layer 19 may be planarized by planarization processing, such as CMP and mechanical polishing, for example.

Figure 22:
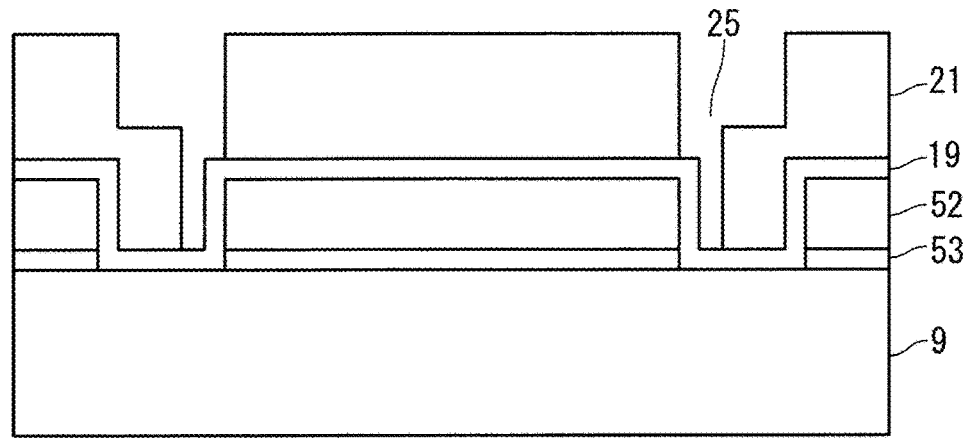
FIG. 22 is a cross-sectional view illustrating the first semiconductor device manufacturing method.

A mask 21 is then formed on the surface 20 of the intervening layer 19 as illustrated in FIG. 22 (step S309). An opening region 25 of the mask 21 is formed in a portion of the through groove 44 and a region of the GaN layer 52 adjacent to the through groove 44 (step S310). Steps S309 and S310 are steps for partially removing the intervening layer 19.

Technology of forming any layer on the entire surface in advance, and then forming a mask to partially remove the layer to form an opening as described above is referred to as etching. On the other hand, technology of forming a mask in advance to partially provide protection so that no layer is formed, and partially removing a layer at the same time as removal of the mask is referred to as lift-off. Any of the steps may be selected for all the partial formation and partial removal of the intervening layer 19 and the like described herein.

Figure 23:
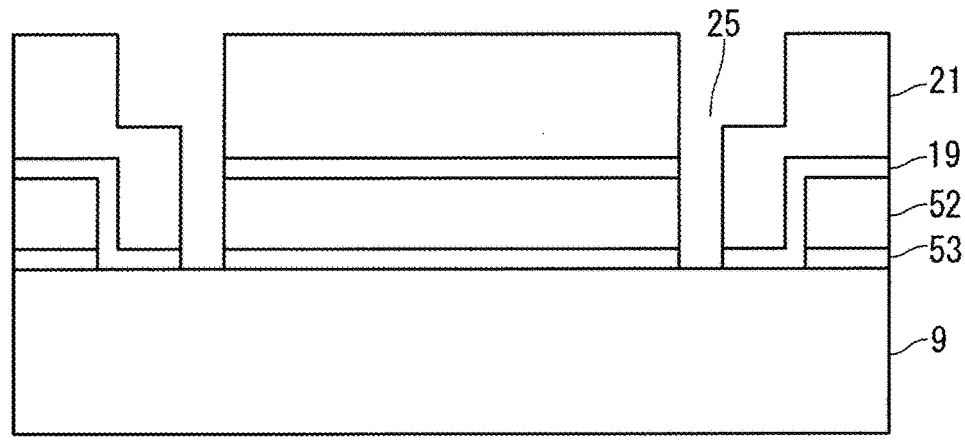
FIG. 23 is a cross-sectional view illustrating the first semiconductor device manufacturing method.

A portion of the intervening layer 19 directly below the opening region 25 of the mask 21 is then removed as illustrated in FIG. 23 (step S311). A method of removing the intervening layer 19 is highly dependent on a material for the intervening layer 19. When the intervening layer 19 is formed of diamond-like carbon, for example, the intervening layer 19 can be removed using ion etching technology or plasma.

Figure 24:
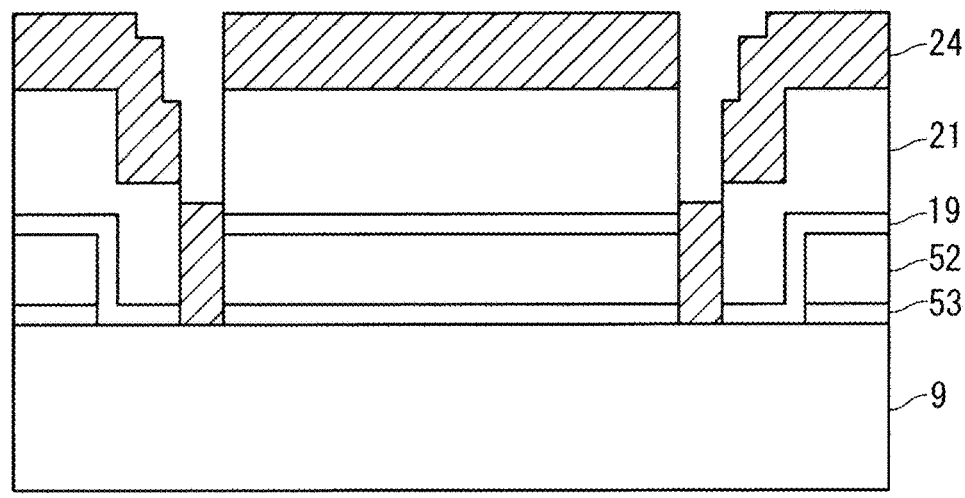
FIG. 24 is a cross-sectional view illustrating the first semiconductor device manufacturing method.

A via metal 24 is then formed using the mask 21 as illustrated in FIG. 24 (step S312). The via metal 24 is desired to be formed of a material having a low Schottky barrier with respect to the GaN layer 52, and facilitating ohmic formation. In an HEMT in which electrons travel as a channel, for example, a Ti/Al-based material is representative of the material for the via metal 24. The effect of reducing ohmic resistance of the source and drain electrodes can be expected when the via metal 24 is formed of the material facilitating formation of an ohmic contact. The via metal 24 is formed by evaporation, sputtering, or application, for example.

Figure 25:
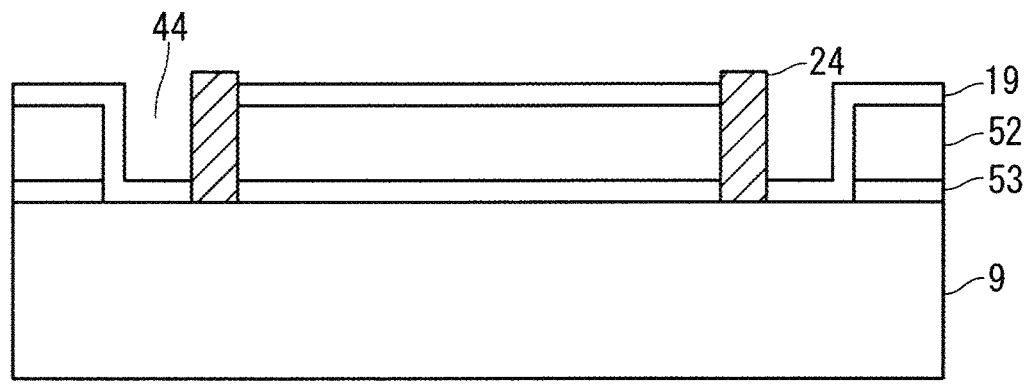
FIG. 25 is a cross-sectional view illustrating the first semiconductor device manufacturing method.

The mask 21 and a portion of the via metal 24 formed on the mask 21 are then removed by lift-off as illustrated in FIG. 25 (step S313). The via metal 24 is thereby formed only within the through groove 44. If there are many lift-off residues, ultrasonic cleaning may additionally be performed. A portion of the via metal 24 remaining without being removed in this step corresponds to the source via metal 502 in Embodiments 1 to 5. The via metal 24 is also referred to as a first metal.

Figure 26:
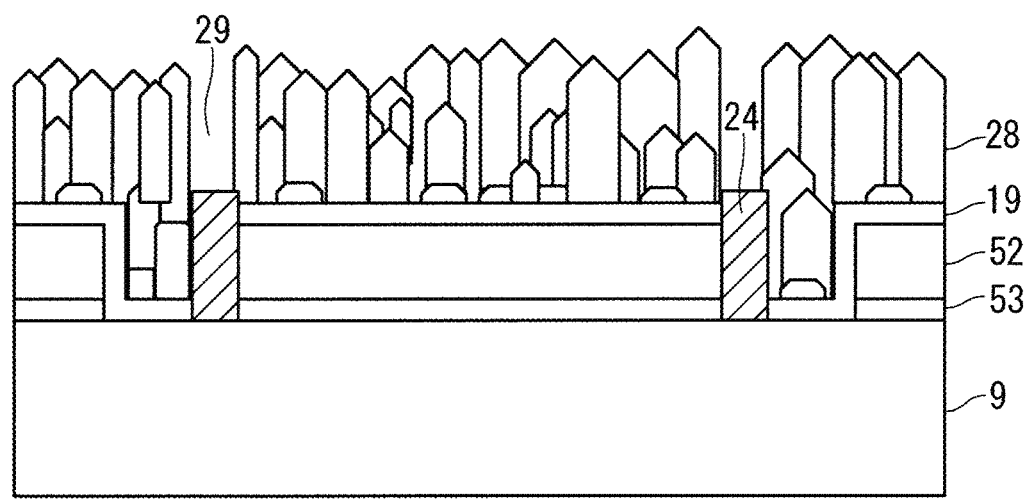
FIG. 26 is a cross-sectional view illustrating the first semiconductor device manufacturing method.

Diamond is then selectively grown directly above the intervening layer 19 as illustrated in FIG. 26 to form a diamond substrate 28 (step S314). The diamond substrate 28 is formed, through the intervening layer 19, above an upper surface of the GaN layer 52 and a surface of the support substrate 9 forming a bottom surface of the through groove 44 in this step. The upper surface of the GaN layer 52 is a second main surface as a main surface of the nitride semiconductor layer opposite the first main surface. Diamond may herein be monocrystalline or polycrystalline diamond. Diamond, however, has higher heat transport properties as it is monocrystalline diamond having long range order, and thus is desired to have large crystal grains and high crystallinity. The diamond substrate 28 corresponds to the diamond substrate 23 in Embodiments 1 to 5. The diamond substrate 28 is not formed directly above the via metal 24, so that a groove 29 is formed. The groove 29 corresponds to the source via hole 501 in Embodiments 1 to 5.

The diamond substrate 28 may be formed by high-temperature and high-pressure synthesis, for example, but should be formed using vapor deposition, such as microwave CVD using a $CH_4$—$H_2$—$O_2$ based gas and hot filament CVD. CVD as described above is suitable for selective growth because diamond can be grown only on the intervening layer 19 having surface compatibility. When vapor deposition is used, however, a film thickness is required to be sufficiently increased for free standing. On the other hand, when a method of bonding a free standing diamond substrate to the intervening layer 19 is used, the free standing substrate is required to be processed to match the through groove 44. A structure in which the GaN layer 52 and the AlGaN layer 53 have been formed within the recess in the upper surface of the diamond substrate 28 is obtained as described above.

Figure 27:
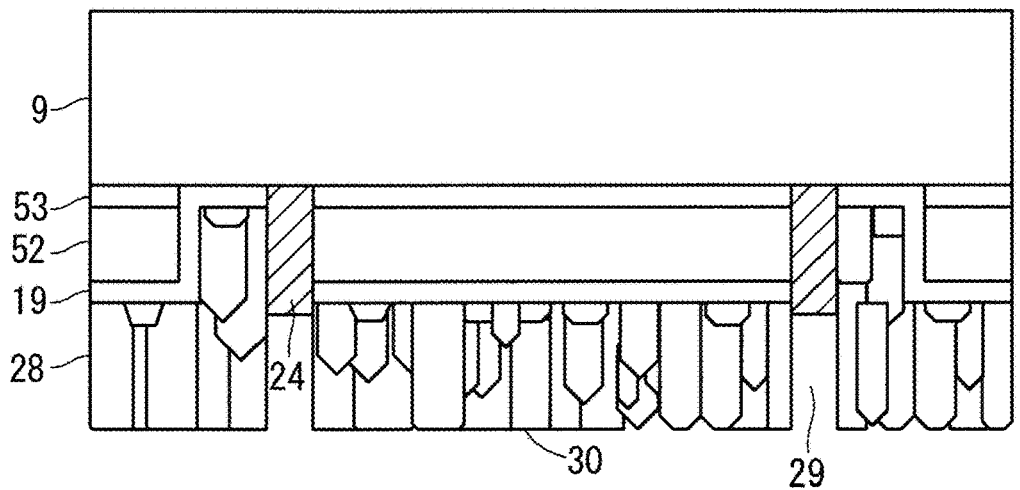
FIG. 27 is a cross-sectional view illustrating the first semiconductor device manufacturing method.

Diamond grown on the intervening layer 19 by CVD tends to be polycrystallized, so that processing to planarize the surface after growth is required. A surface 30 of the diamond substrate 28 is thus planarized as illustrated in FIG. 27 (step S315). The surface 30 of the diamond substrate 28 may be planarized by mechanical polishing or chemical polishing.

Figure 28:
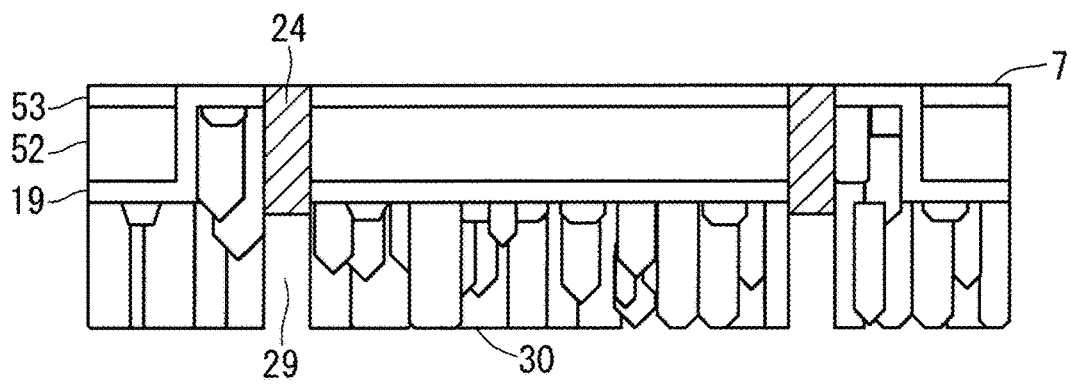
FIG. 28 is a cross-sectional view illustrating the first semiconductor device manufacturing method.

The support substrate 9 is then released from the surface 7 of the AlGaN layer 53 as illustrated in FIG. 28 (step S316). Wet etching using a chemical solution is desired to be used in the release step, for example. However, care should be taken not to impair a configuration other than the released portion using the chemical solution.

The surface 7 of the AlGaN layer 53 is exposed to the environment by releasing the support substrate 9. The surface 7 of the AlGaN layer 53 is subjected to a device process, such as electrode formation, to manufacture a field-effect transistor (FET) (step S317).

Figure 29:
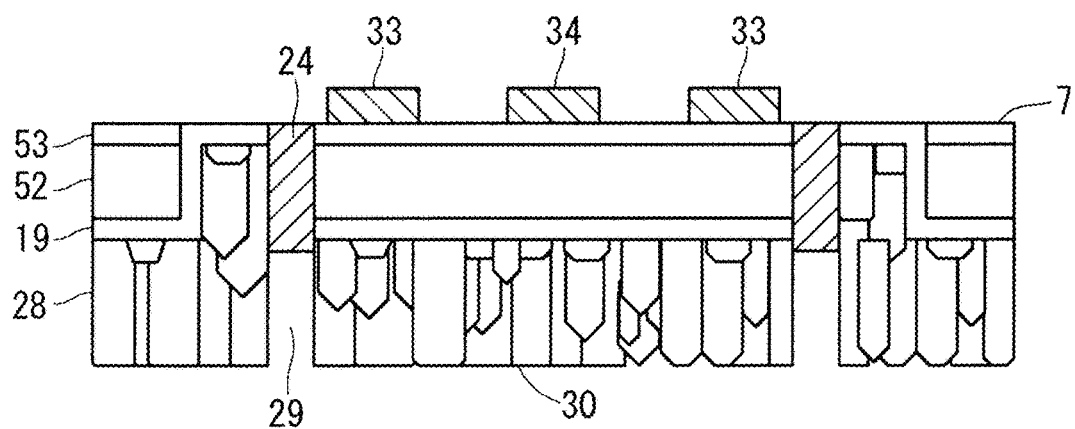
FIG. 29 is a cross-sectional view illustrating the first semiconductor device manufacturing method.
Figure 30:
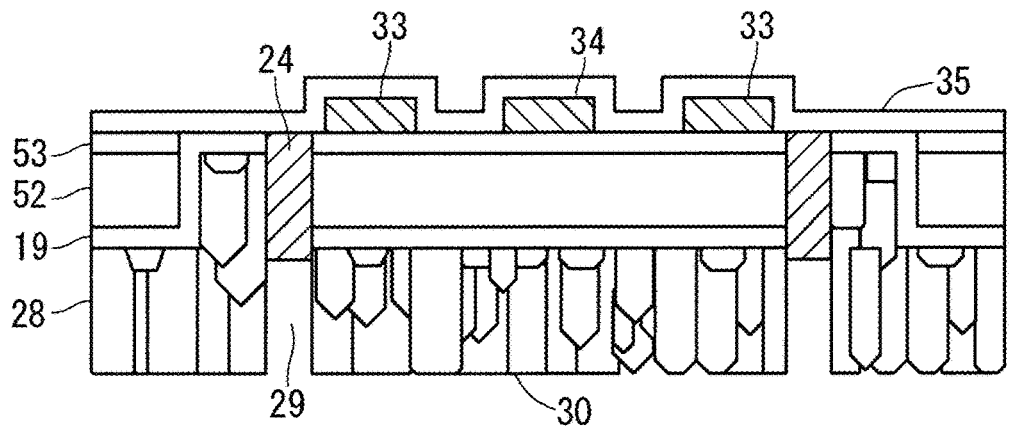
FIG. 30 is a cross-sectional view illustrating the first semiconductor device manufacturing method.
Figure 31:
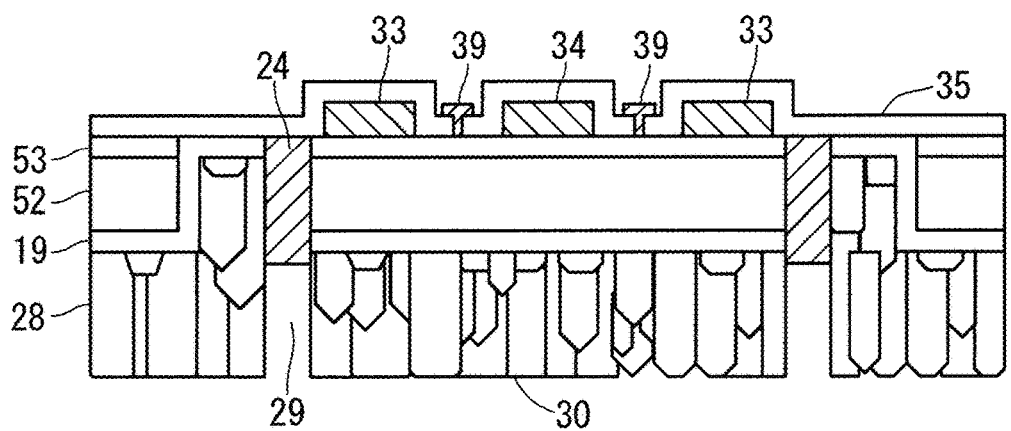
FIG. 31 is a cross-sectional view illustrating the first semiconductor device manufacturing method.

Specifically, a source electrode 33 and a drain electrode 34 are partially manufactured on the surface 7 of the AlGaN layer 53 as illustrated in FIG. 29. A surface protective film 35 covering the AlGaN layer 53, the intervening layer 19, the via metal 24, the source electrode 33, and the drain electrode 34 is then formed as illustrated in FIG. 30. A portion of the surface protective film 35 between the source electrode 33 and the drain electrode 34 is then removed, and a gate electrode 39 is formed in a region where the portion of the surface protective film 35 has been removed as illustrated in FIG. 31. The gate electrode 39 corresponds to the gate electrode 106 in Embodiments 1 to 5. A portion of the surface protective film 35 on the via metal 24 and the source electrode 33 is then removed, and a source pad 40 is formed on the via metal 24 as illustrated in FIG. 32. An air bridge 41 connecting the source pad 40 and the source electrode 33 is then formed. The source electrode 33 and the via metal 24 are thereby brought into electrical contact with each other.

A via filling metal 42 as a second metal is finally formed on the surface 30 of the diamond substrate 28 and an inner wall of the groove 29 as illustrated in FIG. 33 (step S318). The via filling metal 42 corresponds to the source via metal 502 in Embodiments 1 to 5. The semiconductor device 1006 is thus formed.

F-2. Effects

According to the first semiconductor device manufacturing method described above, the through groove 44 extending through the Si substrate 1 and the nitride semiconductor layer is formed before removal of the Si substrate 1 as a whole from the starting substrate as illustrated in FIGS. 18 and 19. Relief of stress due to a lattice mismatch between dissimilar materials is thus distributed to the through groove 44 at removal of the Si substrate 1, and entry of cracking or breakage into the AlGaN layer 53 or the GaN layer 52 can be suppressed. Furthermore, the via metal 24 is formed in advance before formation of the electrodes or the diamond substrate 28, so that ohmic resistance can dramatically be reduced to improve device properties.

Furthermore, the through groove 44 is filled with the diamond substrate 28 having high electrical insulation. Diamond filling the through groove 44 thus performs the isolation function. The isolation step can thereby be simplified in the device process. Specifically, if the selective ion implantation process is used in the isolation step, for example, the process can be omitted. By omitting the selective ion implantation process, a degree of freedom on the process is improved, for example, due to permission for a high-temperature thermal history.

G. Embodiment 7

G-1. Configuration

Figure 34:
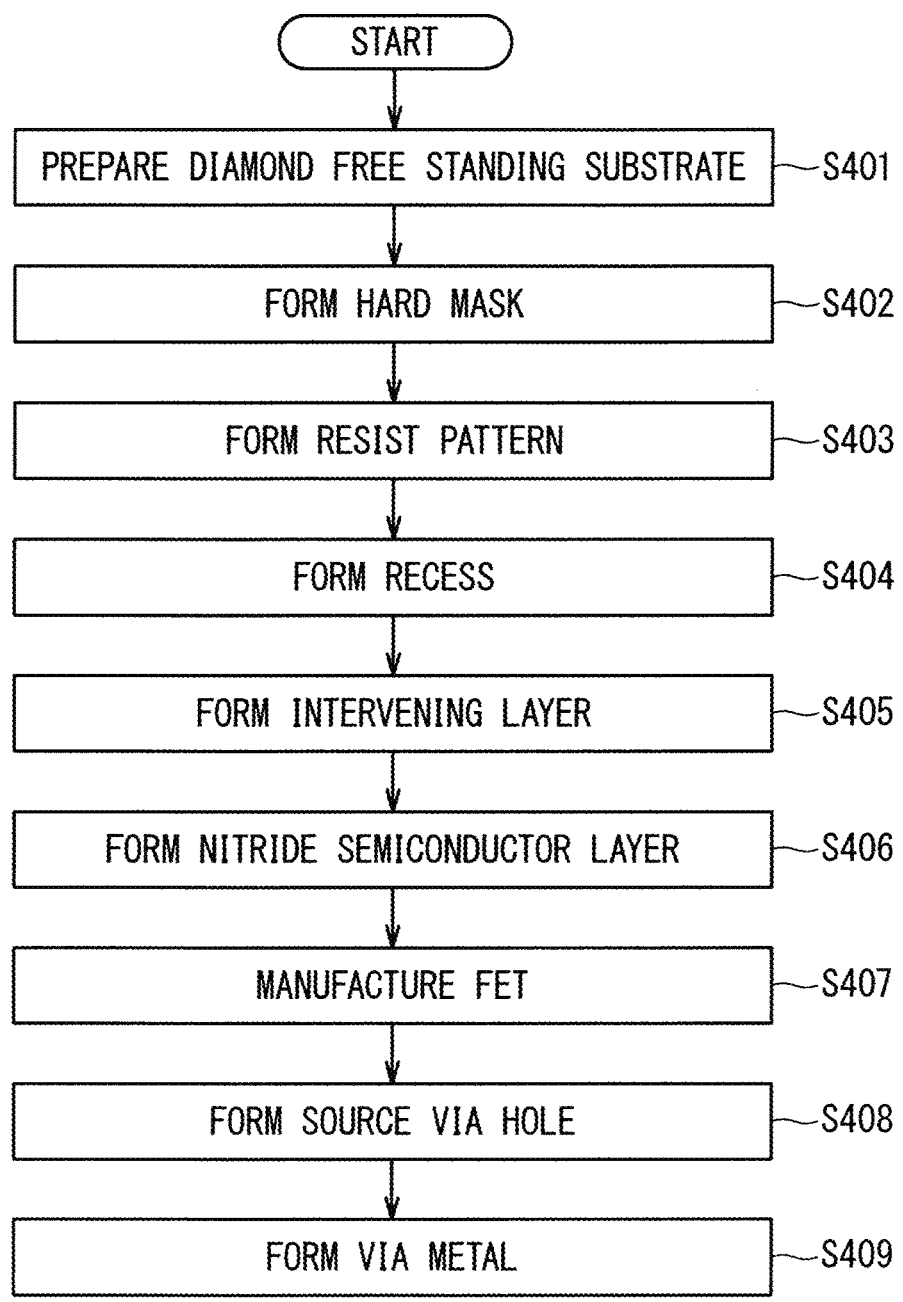
FIG. 34 is a flowchart showing a second semiconductor device manufacturing method.

FIG. 34 is a flowchart showing a second method of manufacturing the semiconductor devices 1001 to 1005. The second method of manufacturing the semiconductor devices 1001 to 1005 will be described below in accordance with the flow of FIG. 34.

Figure 35:
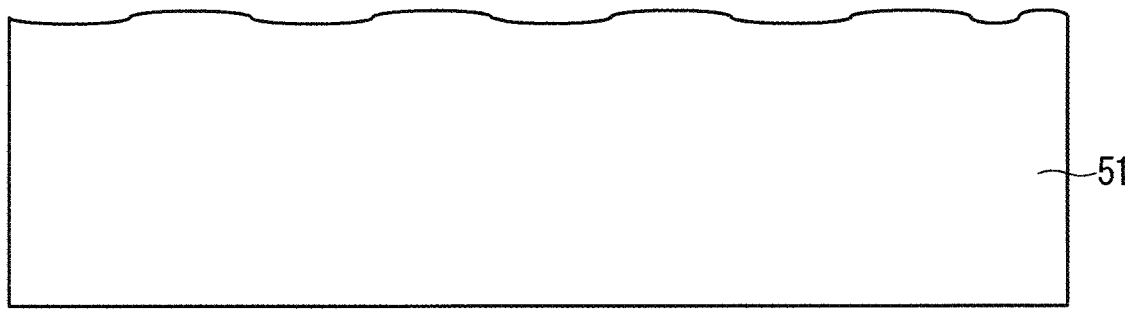
FIG. 35 is a cross-sectional view illustrating the second semiconductor device manufacturing method.
Figure 36:
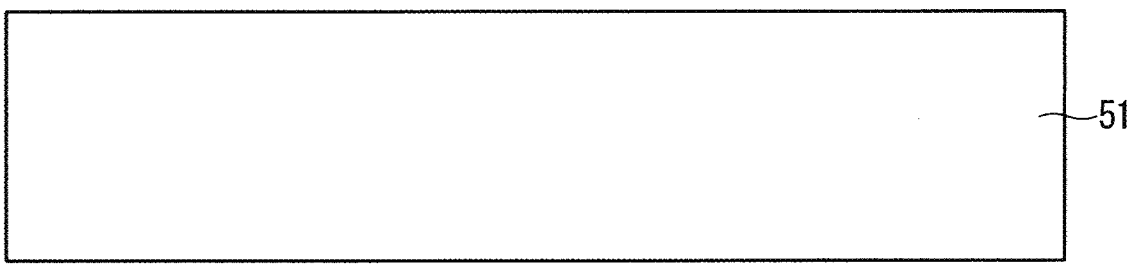
FIG. 36 is a cross-sectional view illustrating the second semiconductor device manufacturing method.

A diamond free standing substrate 51 is prepared first as the starting substrate as illustrated in FIG. 35 (step S401). The diamond free standing substrate 51 is herein desired to have high electrical insulation. A surface of the diamond free standing substrate 51 may be planarized by planarization processing, such as CMP and mechanical polishing, as illustrated in FIG. 36, for example.

Figure 37:
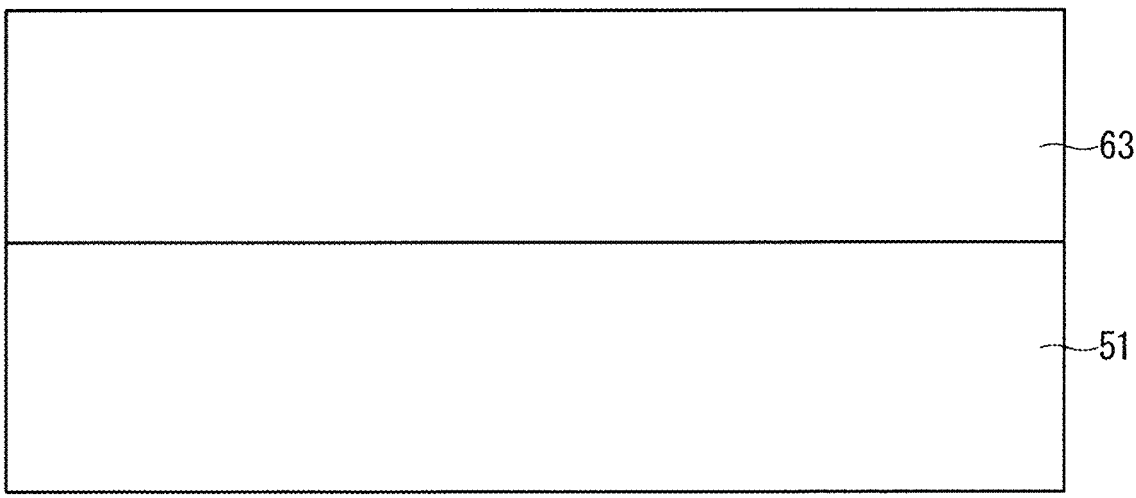
FIG. 37 is a cross-sectional view illustrating the second semiconductor device manufacturing method.

A hard mask 63 is then formed on the surface of the diamond free standing substrate 51 as illustrated in FIG. 37 (step S402). The hard mask 63 is desired to be formed of a material resistant to dry etching and having an etching selectivity ratio to diamond. The hard mask 63 may be formed of silicon nitride, an alumina film, silicon dioxide, or the like, for example. The hard mask 63 may be formed by PVD, CVD, or the like, for example. Not a single layer but two or more layers may be formed as the hard mask 63.

A resist pattern 54 is then formed on the hard mask 63 as illustrated in FIG. 38 (step S403). The resist pattern 54 is formed to form a recess in the diamond free standing substrate 51, and is required to be formed to surround a region of formation of each of the element regions 201 on all sides in plan view. Photolithography technology is used as a method of forming the resist pattern 54, for example. The hard mask 63 is exposed to the external environment in a region corresponding to an opening of the resist pattern 54, and is protected by the resist pattern 54 in the other region.

The region of the hard mask 63 corresponding to the opening of the resist pattern 54 and exposed to the external environment is then removed by development of the resist as illustrated in FIG. 39. The region of the hard mask 63 is removed by wet etching through immersion in a chemical solution or dry etching, for example.

The surface of the diamond free standing substrate 51 is exposed to the external environment in an opening region of the hard mask 63.

A portion of the diamond free standing substrate 51 located directly below the opening region of the hard mask 63 is then removed partially along the film thickness, and the recess 17 is thereby formed in an upper surface of the diamond free standing substrate 51 as illustrated in FIG. 40 (step S404). A side wall of the recess 17 tapers in FIG. 40, but may not taper. The portion of the diamond free standing substrate may be removed by any method appropriate for the purpose of the present embodiment. A removal amount of the diamond free standing substrate 51 is required to be controlled appropriately so that the diamond free standing substrate 51 has a film thickness matching the dimensions of the semiconductor device to be manufactured. Removal of the entire film thickness of the diamond free standing substrate 51 is not expected in this step.

Figure 41:
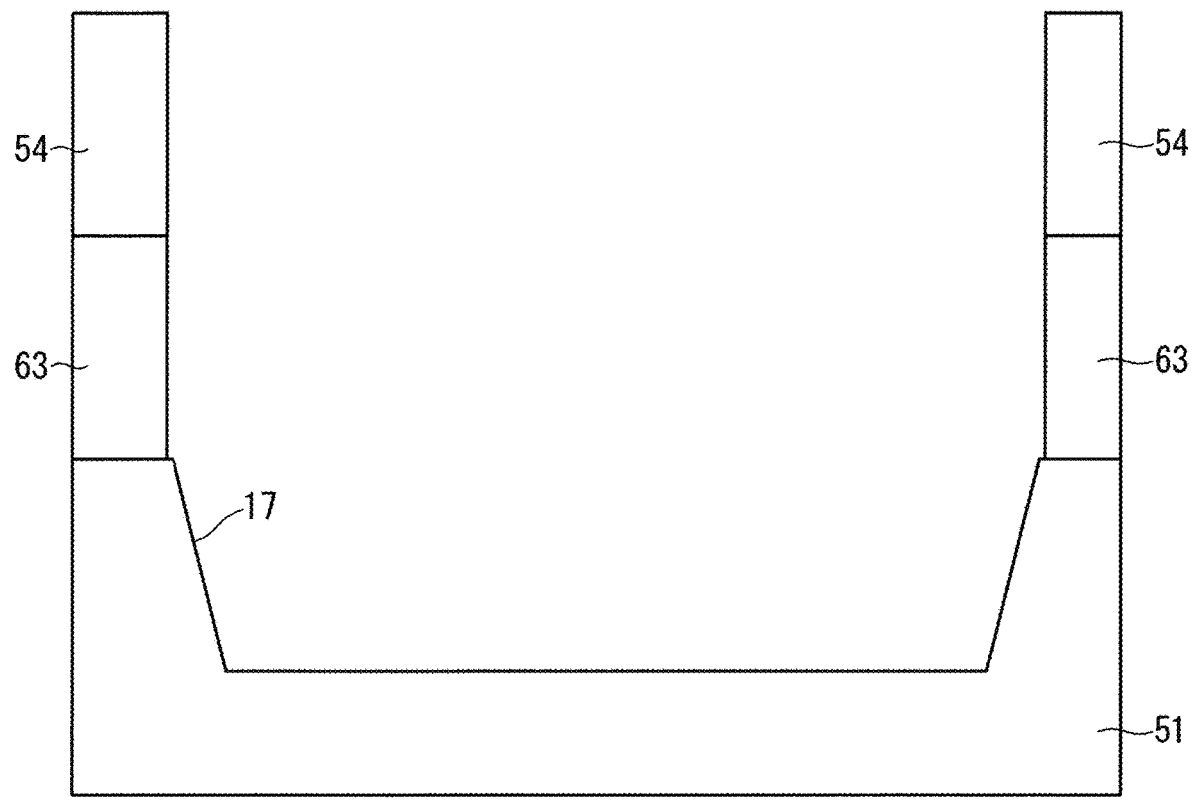
FIG. 41 is a cross-sectional view illustrating the second semiconductor device manufacturing method.
Figure 42:
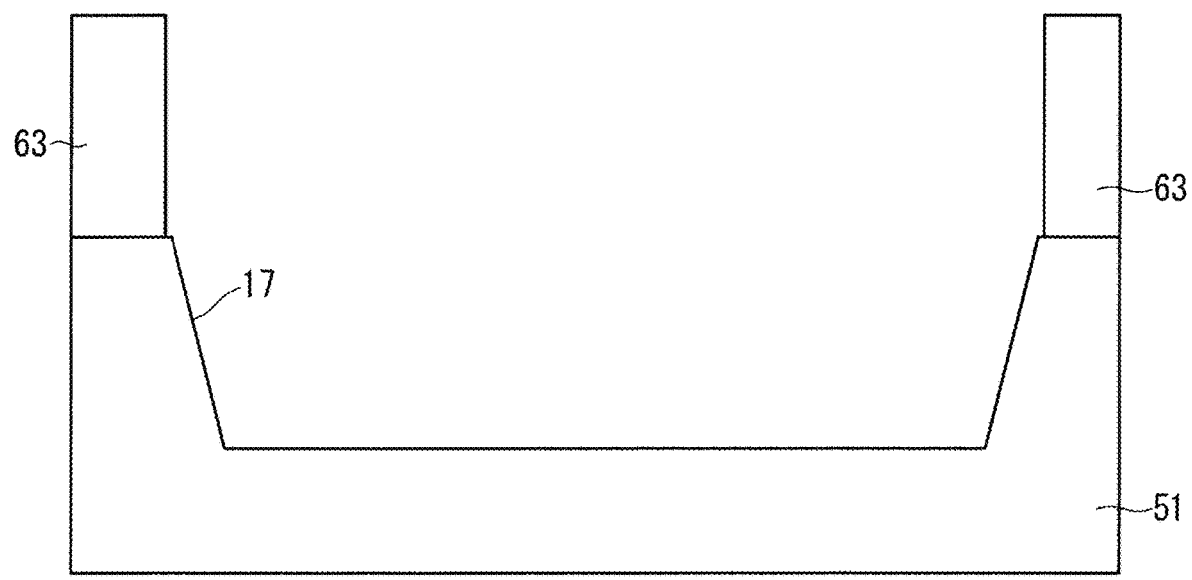
FIG. 42 is a cross-sectional view illustrating the second semiconductor device manufacturing method.

The bottom surface of the recess 17 as an etched surface of the diamond free standing substrate 51 is exposed to the external environment in step S404. The etched surface of the diamond free standing substrate may be planarized by planarization processing, such as CMP and mechanical polishing, as illustrated in FIG. 41, for example. The resist pattern 54 is then separated from the hard mask 63 to expose the hard mask 63 to the external environment as illustrated in FIG. 42.

Figure 43:
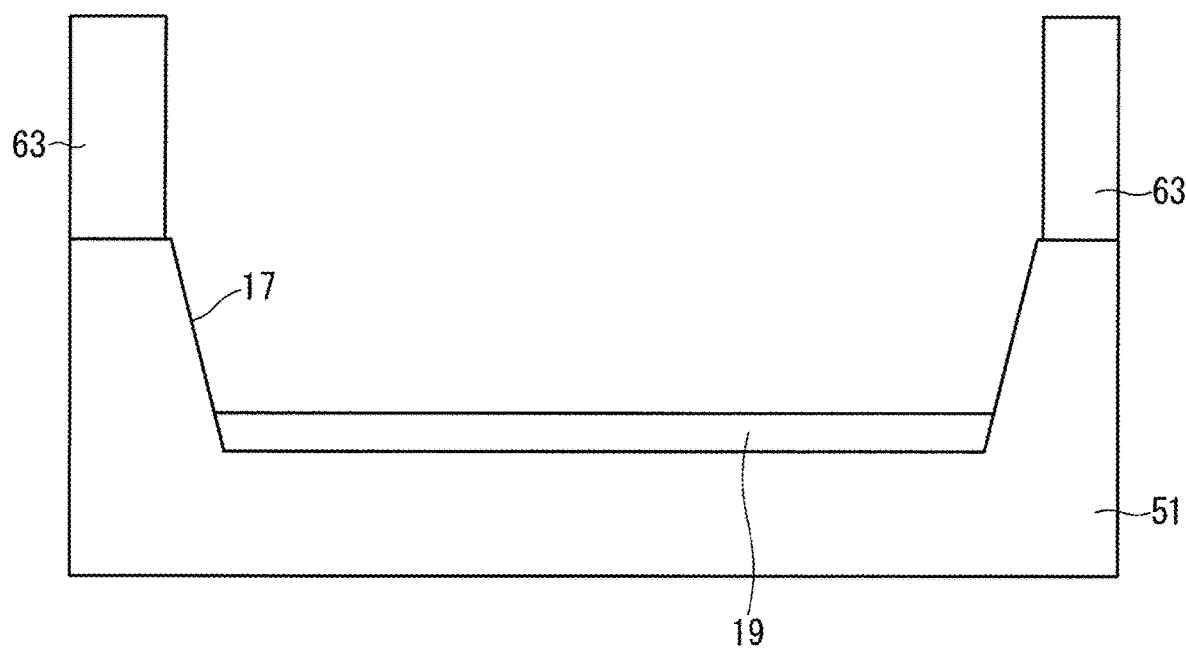
FIG. 43 is a cross-sectional view illustrating the second semiconductor device manufacturing method.

The intervening layer 19 is then formed on the inner wall of the recess 17 of the diamond free standing substrate 51 as illustrated in FIG. 43 (step S405). This step is omitted when the semiconductor device not including the intervening layer 19, such as the semiconductor devices 1001, 1004, and 1005 in Embodiments 1, 4, and 5, is manufactured.

Figure 44:
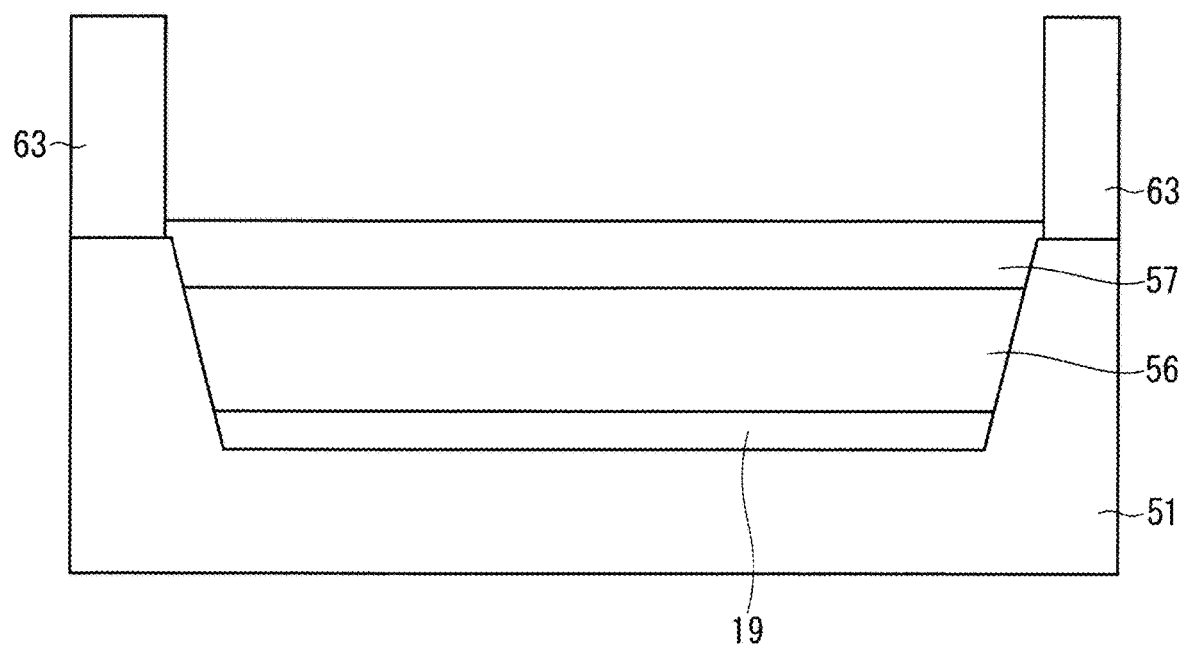
FIG. 44 is a cross-sectional view illustrating the second semiconductor device manufacturing method.

The nitride semiconductor layer is then formed within the recess 17 of the diamond free standing substrate 51 through the intervening layer 19 (step S406). Two nitride semiconductor layers 56 and 57 are illustrated in FIG. 44. The nitride semiconductor layers 56 and 57 respectively correspond to the epitaxial semiconductor layers 2 and 3 in Embodiments 1 to 5. The nitride semiconductor layer may be formed by metal organic chemical vapor deposition (MOCVD), molecular beam epitaxy (MBE), or the like, for example. The nitride semiconductor layer may be formed, for example, using a method of crystal growth of a nitride semiconductor on a graphene film reported by J. W. Shon et al. (J. W. Shon, J. Ohta, K. Ueno, A. Kobayashi, and H. Fujioka, "Structural Properties of GaN films grown on multilayer graphene films by pulsed sputtering", Appl. Phys. Express 7, 085502 (2014)). The nitride semiconductor layer may be formed by any other method of crystal growth appropriate for the purpose of the present embodiment. The intervening layer mitigates a lattice mismatch between the diamond free standing substrate and the nitride semiconductor layer, and, by mitigating the lattice mismatch, the nitride semiconductor layer with fewer crystal defects can be formed.

Although the two nitride semiconductor layers are illustrated in FIG. 44, at least one nitride semiconductor layer is only necessary. In a case of the HEMT device, for example, a first epitaxial semiconductor layer to be an electron travel layer and a second epitaxial semiconductor layer to be a barrier layer are formed to form a 2DEG in step S406. The nitride semiconductor layer to be grown is required to have a controlled thickness, and is required to be flush with the surface of the diamond free standing substrate 51 as a non-etched surface.

A surface of the nitride semiconductor layer 57 is exposed to the external environment in an opening of the hard mask 63. The surface of the nitride semiconductor layer 57 may be planarized by planarization processing, such as CMP and mechanical polishing, for example.

Figure 45:
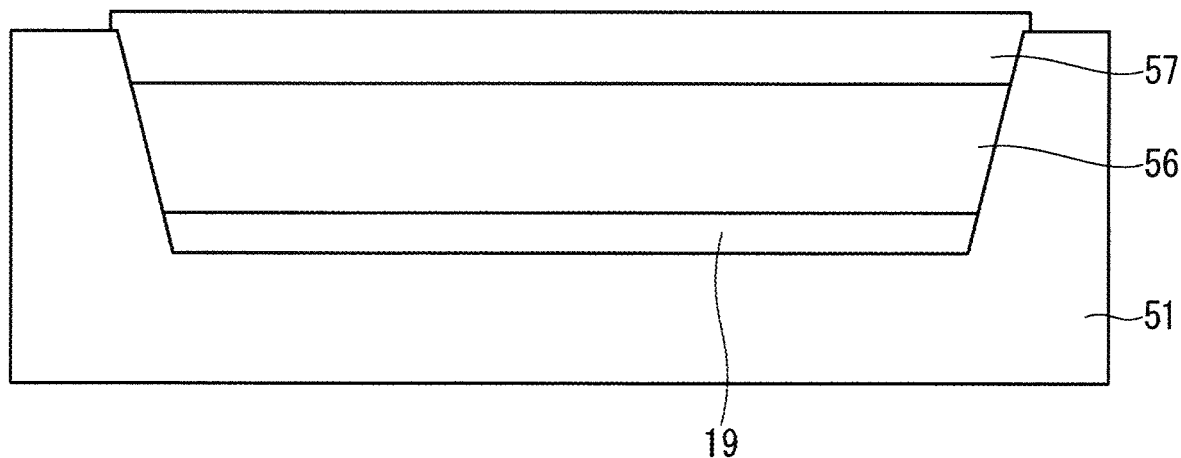
FIG. 45 is a cross-sectional view illustrating the second semiconductor device manufacturing method.
Figure 46:
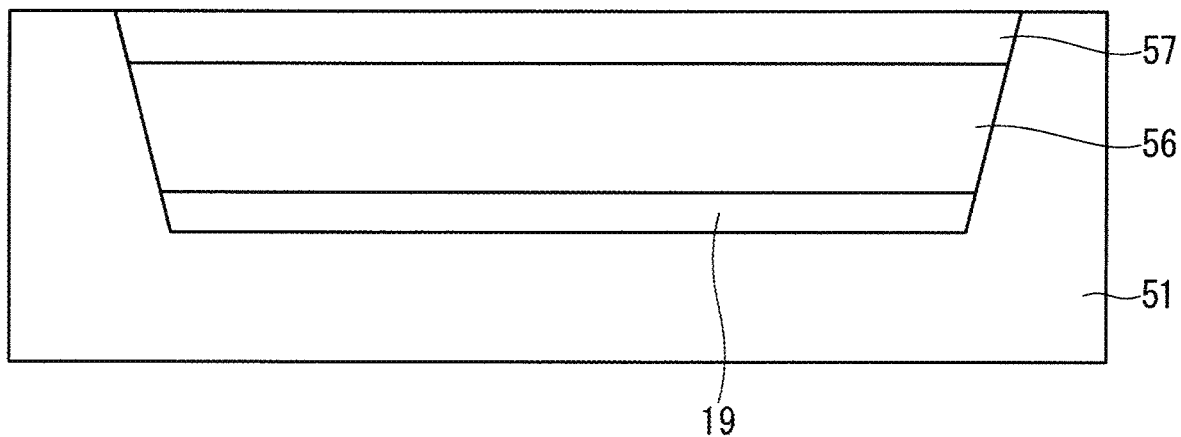
FIG. 46 is a cross-sectional view illustrating the second semiconductor device manufacturing method.

The hard mask 63 on the surface of the diamond free standing substrate 51 is then removed as illustrated in FIG. 45. The hard mask 63 may be removed by wet etching using a chemical solution or dry etching. When a chemical solution to which the nitride semiconductor layer is resistant is used, wet etching causes less damage to the nitride semiconductor layer, and can easily remove the hard mask 63. The surface of the diamond free standing substrate 51 and the surface of the nitride semiconductor layer 57 are caused to be flush with each other by mechanical polishing, etch back, dry etching, CMP, or the like as illustrated in FIG. 46.

Figure 47:
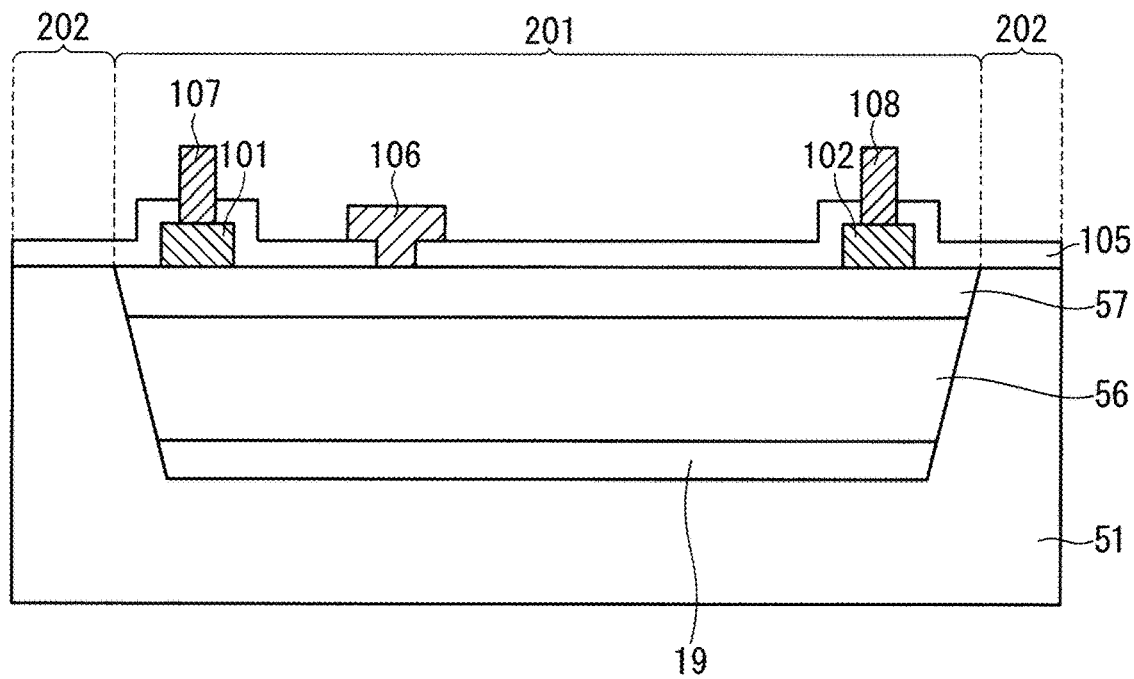
FIG. 47 is a cross-sectional view illustrating the second semiconductor device manufacturing method.

An upper surface of the nitride semiconductor layer 57 is then subjected to a device process, such as formation of the source electrode 101, the drain electrode 102, the gate electrode 106, the source pad 107, and the surface protective film 105, to manufacture a field-effect transistor as illustrated in FIG. 47 (step S407). A structure formed in this step as well as the nitride semiconductor layer constitute the field-effect transistor.

Figure 48:
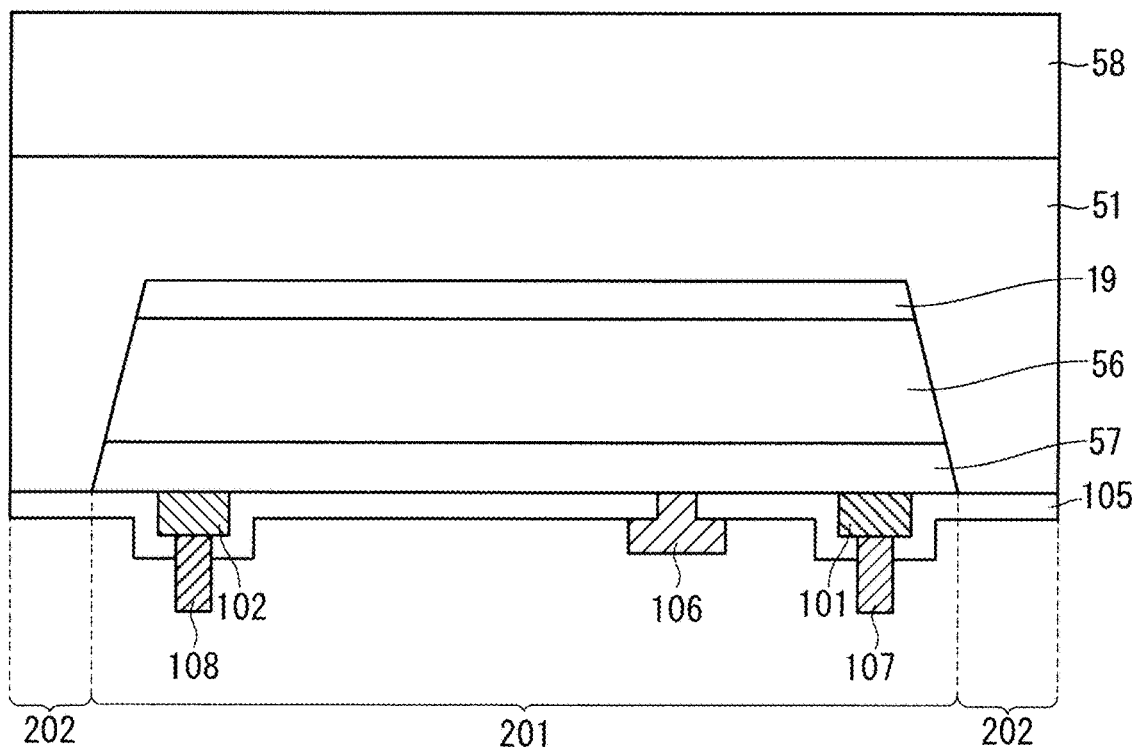
FIG. 48 is a cross-sectional view illustrating the second semiconductor device manufacturing method.
Figure 50:
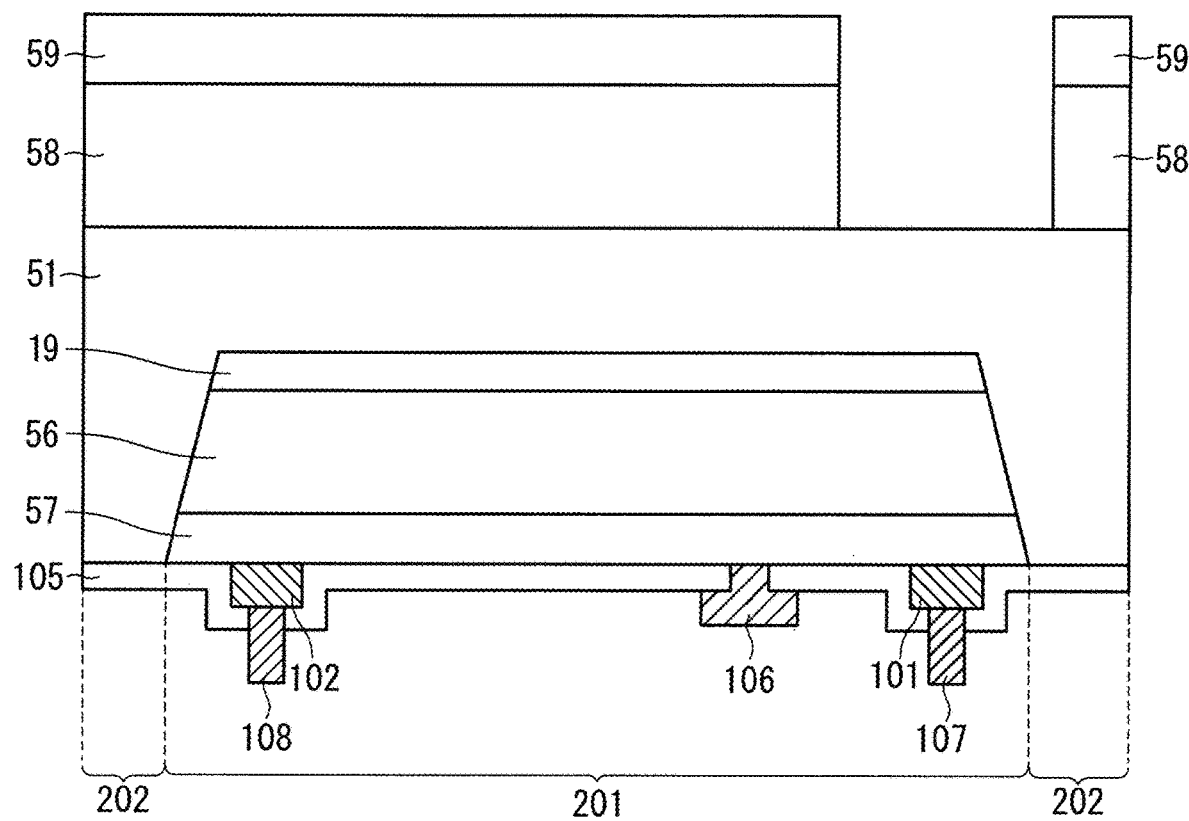
FIG. 50 is a cross-sectional view illustrating the second semiconductor device manufacturing method.
Figure 53:
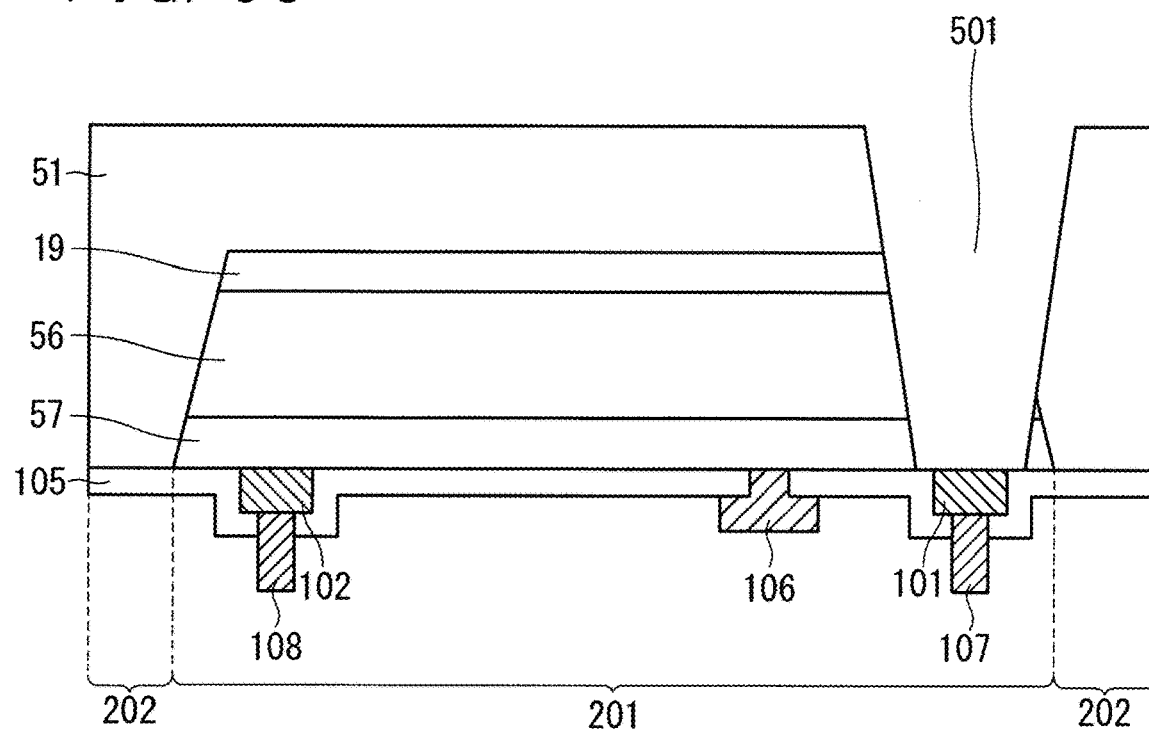
FIG. 53 is a cross-sectional view illustrating the second semiconductor device manufacturing method.

A source via hole is further formed in an unprocessed back surface of the diamond free standing substrate 51 (step S408). Specifically, a hard mask 58 is formed on the back surface of the diamond free standing substrate 51 as illustrated in FIG. 48. A resist pattern 59 is formed on the hard mask 58 by lithography as illustrated in FIG. 49. A region of the hard mask 58 corresponding to a region of formation of the source via hole is opened as illustrated in FIG. 50. The resist pattern 59 is then removed as illustrated in FIG. 51. A portion of the diamond free standing substrate 51 located in the opening of the hard mask 58 is removed by selective etching to form the source via hole 501 as illustrated in FIG. 52. The hard mask 58 is then removed as illustrated in FIG. 53, and the diamond free standing substrate 51 is cleaned. The source via hole 501 extends through the thickness of the diamond free standing substrate in a region of the diamond free standing substrate directly below the source pad formed in the device process in step S407.

Figure 54:
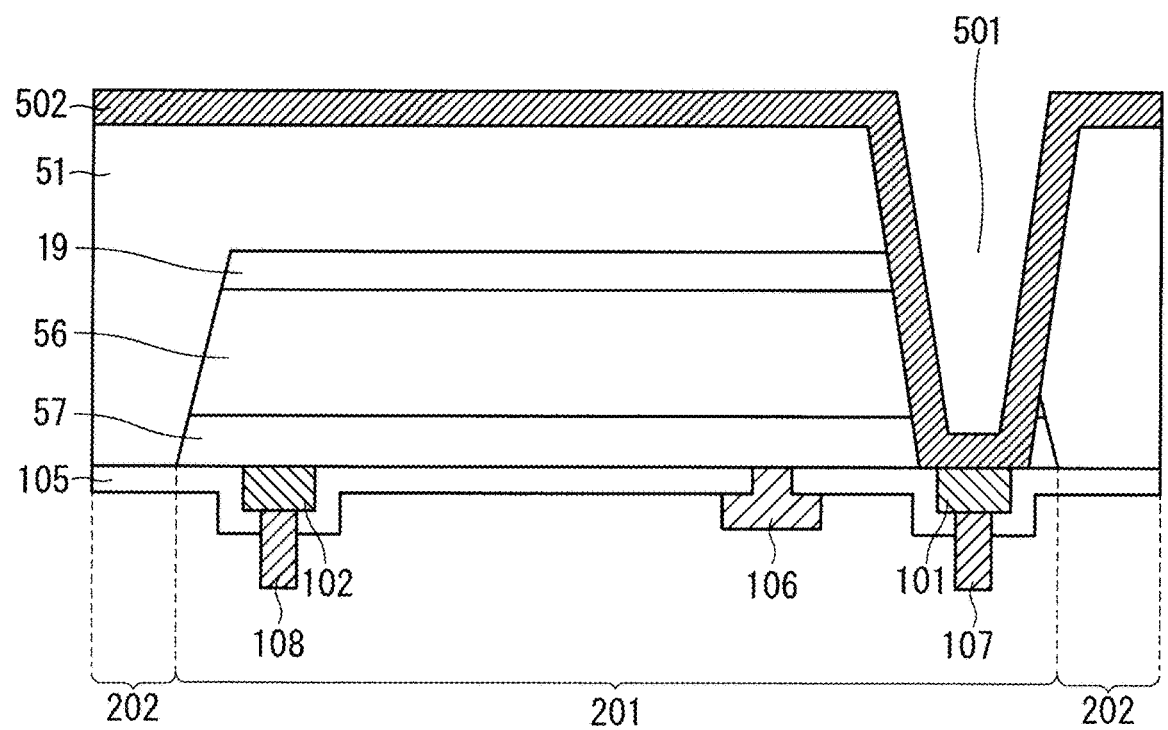
FIG. 54 is a cross-sectional view illustrating the second semiconductor device manufacturing method.

The source via metal 502 is then formed on the inner wall of the source via hole 501 and the back surface of the diamond free standing substrate 51 as illustrated in FIG. 54 (step S409). The source via metal 502 may be formed by any method, such as plating, evaporation, and sputtering. The semiconductor device illustrated in FIG. 55 is thus completed. The semiconductor device corresponds to the semiconductor device 1002 in Embodiment 2.

G-2. Effects

The second semiconductor device manufacturing method described above includes: (a) preparing the diamond free standing substrate; (b) forming the recess in the upper surface of the diamond free standing substrate; (c) epitaxially growing the nitride semiconductor layer within the recess, and (d) forming an electrode layer of the field-effect transistor on the upper surface of the nitride semiconductor layer. This manufacturing method allows for convenient commercial manufacture of the semiconductor devices 1001 to 1005 in Embodiments 1 to 5 when the diamond free standing substrate is commercially achieved. Convenient commercial manufacture of the semiconductor devices 1001 to 1005 in Embodiments 1 to 5 is allowed also when a step of removing the diamond free standing substrate is commercially achieved.

The nitride semiconductor layer is formed within the recess of the diamond free standing substrate, so that diamond having high electrical insulation is adjacent to the nitride semiconductor layer in plan view, and performs the isolation function. The isolation step is thus simplified in the device process.

The effects obtained by the semiconductor device or the manufacturing method thereof in each of the embodiments have been described above. Configurations listed in description of the effects may be replaced by other specific configurations having been described in the description of the present application to the extent that similar effects are produced. The replacement may be made among a plurality of embodiments. That is to say, configurations having been described in different embodiments may be combined with each other to produce similar effects. Configurations having been described in the description of the present application other than the configurations listed in description of the effects can be omitted as appropriate. That is to say, the above-mentioned effects can be produced with at least these configurations. Similar effects can be produced when at least one other configuration having been described in the description of the present application is added to the above-mentioned configurations as appropriate, that is, when another configuration having not been referred to as the above-mentioned configurations but having been described in the description of the present application is added to the above-mentioned configurations as appropriate. A processing order can be changed unless any particular limitation is imposed.

In the above-mentioned embodiments, material properties of, materials for, dimensions of, shapes of, a relative positional relationship among, or conditions for performance of components are sometimes described, but they are each one example in all aspects, and are not limited to those described in the description of the present application. Numerous modifications not having been described and the equivalent can be devised within the scope of the technology disclosed in the description of the present application. For example, a case where at least one component is modified, added, or omitted, and, further, a case where at least one component in at least one embodiment is extracted, and combined with components in another embodiment are included. Unless any contradiction occurs, "one" component described to be included in the above-mentioned embodiments may be "one or more" components to be included.

Furthermore, each component in the above-mentioned embodiments is a conceptual unit, and a case where a single component is composed of a plurality of structures, a case where a single component corresponds to a portion of a structure, and, further, a case where a plurality of components are included in a single structure are included within the scope of the technology disclosed in the description of the present application. Each component in the above-mentioned embodiments includes a structure having another structure or shape as long as the same function is performed.

Description made in the description of the present application is referenced for all the purposes relating to the present technology, and is not acknowledged to be conventional technology. When a name of a material and the like are described in the above-mentioned embodiments without being particularly designated, an alloy and the like containing an additive in addition to the material may be included unless any contradiction occurs.

EXPLANATION OF REFERENCE SIGNS

1 Si substrate, 2, 3 epitaxial semiconductor layer, 9 support substrate, 12 hard mask, 16 protrusion, 17 recess, 19 intervening layer, 23, 28 diamond substrate, 24 via metal, 29 groove, 33, 101 source electrode, 34, 102 drain electrode, 35, 105 surface protective film, 39, 106 gate electrode, 40, 107 source pad, 41 air bridge, 42 via filling metal, 44 through groove, 108 drain pad, 201 element region, 202 isolation region, 501 source via hole, 502 source via metal, 504 source via filler, 601 gate pad, 602 source air bridge, 1001-1006 semiconductor device, 1071 first source pad electrode, 1072 second source pad electrode.

The invention claimed is:

1. A semiconductor device comprising:
    a diamond substrate having a recess in an upper surface thereof;
    a nitride semiconductor layer disposed within the recess in the upper surface of the diamond substrate; and
    an electrode disposed on the nitride semiconductor layer, wherein
    the nitride semiconductor layer and the electrode constitute a field-effect transistor,
    the electrode includes a source electrode,
    the diamond substrate has a source via hole extending through a thickness of the diamond substrate to expose the source electrode,
    the semiconductor device further comprises a via metal covering an inner wall of the source via hole and a lower surface of the diamond substrate, and
    the nitride semiconductor layer is a stacked structure of fine epitaxial semiconductor layers including at least one of a superlattice structure and an interfacial transition layer.

2. The semiconductor device according to claim 1, wherein
    an entire periphery of the recess is surrounded by a protrusion of the diamond substrate in plan view, the protrusion extending from a bottom surface of the recess along a height of the recess.

3. The semiconductor device according to claim 2, wherein
    the upper surface of the diamond substrate and an upper surface of the nitride semiconductor layer are flush with each other.

4. The semiconductor device according to claim 1, wherein
    the diamond substrate has a higher electrical resistivity than the nitride semiconductor layer.

5. The semiconductor device according to claim 1, further comprising
    an intervening layer disposed between the diamond substrate and the nitride semiconductor layer.

6. The semiconductor device according to claim 1, wherein
    the source via hole is filled with diamond.

7. The semiconductor device according to claim 1, wherein
    the field-effect transistor is a multi-finger field-effect transistor.

8. The semiconductor device according to claim 7, wherein
    the recess comprises a plurality of recesses in the upper surface of the diamond substrate,
    the electrode includes the source electrode and a drain electrode,
    there is a protrusion of the diamond substrate between two adjacent recesses of the plurality of recesses, the protrusion extending from bottom surfaces of the recesses along a height of each of the recesses, and
    the source electrode or the drain electrode is located on the protrusion.

9. A semiconductor device manufacturing method comprising:
    forming a nitride semiconductor layer on a semiconductor substrate;
    bonding a support substrate to a first main surface of the nitride semiconductor layer, the first main surface being a main surface of the nitride semiconductor layer opposite the semiconductor substrate;
    after bonding the support substrate, forming a through groove extending through thicknesses of the semiconductor substrate and the nitride semiconductor layer;
    after forming the through groove, removing the semiconductor substrate;
    forming a first metal on a portion of an interior of the through groove;
    forming a diamond layer over a second main surface of the nitride semiconductor layer and in a region of the interior of the through groove where the first metal is not formed, the second main surface being a main surface of the nitride semiconductor layer opposite the first main surface;

after forming the diamond layer, releasing the support substrate from the first main surface of the nitride semiconductor layer;

after releasing the support substrate, forming an electrode of a field-effect transistor on the first main surface of the nitride semiconductor layer, and bringing a source electrode of the field-effect transistor into electrical contact with the first metal; and forming a second metal in contact with the first metal and a surface of the diamond layer.

10. The semiconductor device manufacturing method according to claim 9, wherein an intervening layer is formed on the second main surface of the nitride semiconductor layer between removal of the semiconductor substrate and formation of the first metal.

11. A semiconductor device manufacturing method comprising:

preparing a free-standing diamond substrate;

forming a recess in an upper surface of the free-standing diamond substrate;

epitaxially growing a nitride semiconductor layer within the recess such that the nitride semiconductor layer completely fills the recess; and forming an electrode layer of a field-effect transistor on an upper surface of the nitride semiconductor layer.

12. The semiconductor device manufacturing method according to claim 11, wherein a source via hole extending through a thickness of the diamond substrate is formed in a region of the free-standing diamond substrate directly below a source pad of the field-effect transistor, and a via metal is formed on an inner wall of the source via hole.

13. The semiconductor device manufacturing method according to claim 11, further comprising forming an intervening layer on an inner wall of the recess between formation of the recess and epitaxial growth of the nitride semiconductor layer.

14. The semiconductor device according to claim 1, wherein the source via hole is completely filled with a diamond source via filler such that a lower surface of the diamond source via filler is flush with the lower surface of the diamond substrate or a lower surface of the via metal.

* * * * *